(12) United States Patent
Zhu et al.

(10) Patent No.: US 9,305,999 B2
(45) Date of Patent: Apr. 5, 2016

(54) STRESS-GENERATING STRUCTURE FOR SEMICONDUCTOR-ON-INSULATOR DEVICES

(71) Applicant: GLOBALFOUNDRIES INC., Grand Cayman (KY)

(72) Inventors: Huilong Zhu, Poughkeepsie, NY (US); Brian J. Greene, Fishkill, NY (US); Dureseti Chidambarrao, Weston, CT (US); Gregory G. Freeman, Wappinger Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 103 days.

(21) Appl. No.: 13/778,419

(22) Filed: Feb. 27, 2013

(65) Prior Publication Data
US 2013/0168804 A1 Jul. 4, 2013

Related U.S. Application Data

(62) Division of application No. 13/370,898, filed on Feb. 10, 2012, now Pat. No. 8,629,501, which is a division of application No. 11/860,851, filed on Sep. 25, 2007, now Pat. No. 8,115,254.

(51) Int. Cl.
*H01L 21/331* (2006.01)
*H01L 21/8222* (2006.01)
(Continued)

(52) U.S. Cl.
CPC ...... *H01L 29/0603* (2013.01); *H01L 21/76224* (2013.01); *H01L 29/1025* (2013.01); *H01L 29/84* (2013.01); *H01L 29/1054* (2013.01)

(58) Field of Classification Search
CPC .............. H01L 21/823878; H01L 27/1203; H01L 21/76283; H01L 21/76264; H01L 21/76224
USPC .......................................... 438/311, 412, 517
See application file for complete search history.

(56) References Cited

U.S. PATENT DOCUMENTS 3,602,841 A 8/1971 McGroddy
4,665,415 A 5/1987 Esaki et al.
(Continued)

FOREIGN PATENT DOCUMENTS

CN 1591826 A 3/2005
JP 6476755 3/1989

OTHER PUBLICATIONS

Rim et al., "Transductance Enhancement in Deep Submicron Strained-Si n-MOSFETs", International Electron Devices Meeting, IEEE, 1998, 26.8.1-26.8.4.
(Continued)

*Primary Examiner* — Jerome Jackson, Jr.
*Assistant Examiner* — David Chen
(74) *Attorney, Agent, or Firm* — Scully, Scott, Murphy & Presser, P.C.

(57) ABSTRACT

A stack pad layers including a first pad oxide layer, a pad nitride layer, and a second pad oxide layer are formed on a semiconductor-on-insulator (SOI) substrate. A deep trench extending below a top surface or a bottom surface of a buried insulator layer of the SOI substrate and enclosing at least one top semiconductor region is formed by lithographic methods and etching. A stress-generating insulator material is deposited in the deep trench and recessed below a top surface of the SOI substrate to form a stress-generating buried insulator plug in the deep trench. A silicon oxide material is deposited in the deep trench, planarized, and recessed. The stack of pad layer is removed to expose substantially coplanar top surfaces of the top semiconductor layer and of silicon oxide plugs. The stress-generating buried insulator plug encloses, and generates a stress to, the at least one top semiconductor region.

14 Claims, 19 Drawing Sheets

(51) Int. Cl.
 *H01L 29/06* (2006.01)
 *H01L 29/10* (2006.01)
 *H01L 29/84* (2006.01)
 *H01L 21/762* (2006.01)

(56) References Cited

U.S. PATENT DOCUMENTS

| | | |
|---|---|---|
| 4,853,076 A | 8/1989 | Tsaur et al. |
| 4,855,245 A | 8/1989 | Neppl et al. |
| 4,952,524 A | 8/1990 | Lee et al. |
| 4,958,213 A | 9/1990 | Eklund et al. |
| 4,969,023 A | 11/1990 | Svedberg |
| 5,006,913 A | 4/1991 | Sugahara et al. |
| 5,060,030 A | 10/1991 | Hoke et al. |
| 5,081,513 A | 1/1992 | Jackson et al. |
| 5,108,843 A | 4/1992 | Ohtaka et al. |
| 5,134,085 A | 7/1992 | Gilgen et al. |
| 5,268,330 A | 12/1993 | Givens et al. |
| 5,310,446 A | 5/1994 | Konishi et al. |
| 5,354,695 A | 10/1994 | Leedy |
| 5,371,399 A | 12/1994 | Burroughes et al. |
| 5,391,510 A | 2/1995 | Hsu et al. |
| 5,459,346 A | 10/1995 | Asakawa et al. |
| 5,471,948 A | 12/1995 | Burroughes et al. |
| 5,557,122 A | 9/1996 | Shrivastava et al. |
| 5,561,302 A | 10/1996 | Candelaria |
| 5,565,697 A | 10/1996 | Asakawa et al. |
| 5,571,741 A | 11/1996 | Leedy |
| 5,583,369 A | 12/1996 | Yamazaki et al. |
| 5,592,007 A | 1/1997 | Leedy |
| 5,592,009 A | 1/1997 | Hidaka |
| 5,592,018 A | 1/1997 | Leedy |
| 5,670,798 A | 9/1997 | Schetzina |
| 5,679,965 A | 10/1997 | Schetzina |
| 5,683,934 A | 11/1997 | Candelaria |
| 5,698,869 A | 12/1997 | Yoshimi et al. |
| 5,840,593 A | 11/1998 | Leedy |
| 5,841,170 A | 11/1998 | Adan et al. |
| 5,861,651 A | 1/1999 | Brasen et al. |
| 5,880,040 A | 3/1999 | Sun et al. |
| 5,940,716 A | 8/1999 | Jin et al. |
| 5,940,736 A | 8/1999 | Brady et al. |
| 5,946,559 A | 8/1999 | Leedy |
| 5,960,297 A | 9/1999 | Saki |
| 5,989,978 A | 11/1999 | Peidous |
| 6,008,126 A | 12/1999 | Leedy |
| 6,025,280 A | 2/2000 | Brady et al. |
| 6,046,464 A | 4/2000 | Schetzina |
| 6,066,545 A | 5/2000 | Doshi et al. |
| 6,090,684 A | 7/2000 | Ishitsuka et al. |
| 6,107,143 A | 8/2000 | Park et al. |
| 6,117,722 A | 9/2000 | Wuu et al. |
| 6,133,071 A | 10/2000 | Nagai |
| 6,165,383 A | 12/2000 | Chou |
| 6,221,735 B1 | 4/2001 | Manley et al. |
| 6,228,694 B1 | 5/2001 | Doyle et al. |
| 6,246,095 B1 | 6/2001 | Brady et al. |
| 6,255,169 B1 | 7/2001 | Li et al. |
| 6,255,695 B1 | 7/2001 | Kubota et al. |
| 6,261,964 B1 | 7/2001 | Wu et al. |
| 6,265,317 B1 | 7/2001 | Chiu et al. |
| 6,274,444 B1 | 8/2001 | Wang |
| 6,281,532 B1 | 8/2001 | Doyle et al. |
| 6,284,623 B1 | 9/2001 | Zhang et al. |
| 6,284,626 B1 | 9/2001 | Kim |
| 6,319,794 B1 | 11/2001 | Akatsu et al. |
| 6,361,885 B1 | 3/2002 | Chou |
| 6,362,082 B1 | 3/2002 | Doyle et al. |
| 6,368,931 B1 | 4/2002 | Kuhn et al. |
| 6,403,486 B1 | 6/2002 | Lou |
| 6,403,975 B1 | 6/2002 | Brunner et al. |
| 6,406,973 B1 | 6/2002 | Lee |
| 6,461,936 B1 | 10/2002 | von Ehrenwall |
| 6,468,872 B1 | 10/2002 | Yang |
| 6,476,462 B2 | 11/2002 | Shimizu et al. |
| 6,483,171 B1 | 11/2002 | Forbes et al. |
| 6,493,497 B1 | 12/2002 | Ramdani et al. |
| 6,498,358 B1 | 12/2002 | Lach et al. |
| 6,501,121 B1 | 12/2002 | Yu et al. |
| 6,506,652 B2 | 1/2003 | Jan et al. |
| 6,509,618 B2 | 1/2003 | Jan et al. |
| 6,521,964 B1 | 2/2003 | Jan et al. |
| 6,531,369 B1 | 3/2003 | Ozkan et al. |
| 6,531,740 B2 | 3/2003 | Bosco et al. |
| 6,570,169 B2 | 5/2003 | Suguro et al. |
| 6,605,498 B1 | 8/2003 | Murthy et al. |
| 6,621,131 B2 | 9/2003 | Murthy et al. |
| 6,621,392 B1 | 9/2003 | Volant et al. |
| 6,635,506 B2 | 10/2003 | Volant et al. |
| 6,717,216 B1 | 4/2004 | Doris et al. |
| 6,747,333 B1 | 6/2004 | Xiang et al. |
| 6,806,584 B2 | 10/2004 | Fung et al. |
| 6,815,278 B1 | 11/2004 | Ieong et al. |
| 6,825,529 B2 | 11/2004 | Chidambarrao et al. |
| 6,831,292 B2 | 12/2004 | Currie et al. |
| 6,869,866 B1 | 3/2005 | Chidambarrao et al. |
| 6,890,808 B2 | 5/2005 | Chidambarrao et al. |
| 6,930,030 B2 | 8/2005 | Rausch et al. |
| 6,964,892 B2 | 11/2005 | Clevenger et al. |
| 6,972,478 B1 * | 12/2005 | Waite ............ H01L 21/823807 257/347 |
| 6,974,981 B2 | 12/2005 | Chidambarrao et al. |
| 6,977,194 B2 | 12/2005 | Belyansky et al. |
| 6,998,657 B2 | 2/2006 | Rhodes |
| 7,015,082 B2 | 3/2006 | Doris et al. |
| 7,023,018 B2 | 4/2006 | Buss |
| 7,023,055 B2 | 4/2006 | Ieong et al. |
| 7,166,528 B2 | 1/2007 | Kim et al. |
| 7,268,024 B2 | 9/2007 | Yeo et al. |
| 7,329,923 B2 | 2/2008 | Doris et al. |
| 7,429,775 B1 | 9/2008 | Nayak et al. |
| 7,528,465 B2 | 5/2009 | King et al. |
| 2001/0009784 A1 | 7/2001 | Ma et al. |
| 2002/0063292 A1 | 5/2002 | Armstrong et al. |
| 2002/0074598 A1 | 6/2002 | Doyle et al. |
| 2002/0086472 A1 | 7/2002 | Roberds et al. |
| 2002/0086497 A1 | 7/2002 | Kwok |
| 2002/0090791 A1 | 7/2002 | Doyle et al. |
| 2002/0119638 A1 | 8/2002 | Wilson et al. |
| 2003/0032261 A1 | 2/2003 | Yeh et al. |
| 2003/0040158 A1 | 2/2003 | Saitoh |
| 2003/0057184 A1 | 3/2003 | Yu et al. |
| 2003/0067035 A1 | 4/2003 | Tews et al. |
| 2003/0127697 A1 * | 7/2003 | Ohta ................... B82Y 10/00 257/390 |
| 2003/0129791 A1 | 7/2003 | Yamazaki |
| 2003/0181005 A1 | 9/2003 | Hachimine et al. |
| 2004/0029323 A1 | 2/2004 | Shimizu et al. |
| 2004/0051144 A1 | 3/2004 | Webb et al. |
| 2004/0113174 A1 | 6/2004 | Chidambarrao et al. |
| 2004/0113217 A1 | 6/2004 | Chidambarrao et al. |
| 2004/0173815 A1 | 9/2004 | Yeo et al. |
| 2004/0238914 A1 | 12/2004 | Deshpande et al. |
| 2004/0262784 A1 | 12/2004 | Doris et al. |
| 2004/0266135 A1 | 12/2004 | Dong et al. |
| 2005/0017304 A1 | 1/2005 | Matsuhita |
| 2005/0040460 A1 | 2/2005 | Chidambarrao et al. |
| 2005/0082634 A1 | 4/2005 | Doris et al. |
| 2005/0093030 A1 | 5/2005 | Doris et al. |
| 2005/0098234 A1 | 5/2005 | Nakaharai et al. |
| 2005/0098829 A1 | 5/2005 | Doris et al. |
| 2005/0101091 A1 | 5/2005 | Iwamatsu et al. |
| 2005/0106799 A1 | 5/2005 | Doris et al. |
| 2005/0139929 A1 | 6/2005 | Rost |
| 2005/0145954 A1 | 7/2005 | Zhu et al. |
| 2005/0148146 A1 | 7/2005 | Doris et al. |
| 2005/0184345 A1 | 8/2005 | Lin et al. |
| 2005/0194699 A1 | 9/2005 | Belyansky et al. |
| 2005/0236668 A1 | 10/2005 | Zhu et al. |
| 2005/0245017 A1 | 11/2005 | Belyansky et al. |
| 2005/0247926 A1 | 11/2005 | Sun et al. |
| 2005/0280051 A1 | 12/2005 | Chidambarrao et al. |
| 2005/0282325 A1 | 12/2005 | Belyansky et al. |
| 2006/0022266 A1 | 2/2006 | Messenger et al. |

(56) References Cited

U.S. PATENT DOCUMENTS

| | | | |
|---|---|---|---|
| 2006/0027868 | A1 | 2/2006 | Doris et al. |
| 2006/0046409 | A1* | 3/2006 | Fujimaki ............... 438/309 |
| 2006/0057787 | A1 | 3/2006 | Doris et al. |
| 2006/0060925 | A1 | 3/2006 | Doris et al. |
| 2006/0094212 | A1 | 5/2006 | Noguchi et al. |
| 2006/0110892 | A1 | 5/2006 | Orlowski et al. |
| 2006/0160363 | A1* | 7/2006 | Furukawa ........ H01L 21/3143 438/704 |
| 2006/0177998 | A1 | 8/2006 | Lin et al. |
| 2006/0246641 | A1 | 11/2006 | Kammler et al. |
| 2006/0292770 | A1* | 12/2006 | Wu et al. ............... 438/187 |
| 2007/0015347 | A1 | 1/2007 | Mehta et al. |
| 2007/0034963 | A1 | 2/2007 | Sudo |
| 2007/0166901 | A1 | 7/2007 | Lee |
| 2007/0190715 | A1* | 8/2007 | Ohta ............... 438/221 |
| 2007/0212874 | A1* | 9/2007 | Sandhu ............... 438/637 |
| 2007/0257315 | A1 | 11/2007 | Bedell et al. |
| 2008/0303090 | A1* | 12/2008 | Ieong et al. ............... 257/351 |
| 2009/0026549 | A1 | 1/2009 | Teh et al. |

OTHER PUBLICATIONS

Rim et al., "Characteristics and Device Design of Sub-100 nm Strained Si N- and PMOSFETs", Symposium on VLSI Technology Digest of Technical Papers, IEEE, 2002, pp. 98-99.

Scott et al., NMOS Drive Current Reduction Caused by Transistor Layout and Trench Isolation Induced Stress, International Electron Devices Meeting, IEEE, 1999, 34.4.1-34.4.4.

Ootsuka et al., "A Highly Dense, High-Performance 130nm Node CMOS Technology for Large Scale System-on-a-Chip Applications", International Electron Devices Meeting, IEEE, 2000, 23.5.1-23.5.4.

Ito et al., "Mechanical Stress Effect of Etch-Stop Nitride and its Impact on Deep Submicron Transistor Design", International Electron Devices Meeting, IEEE, 2000, 10.7.1-10.7.4.

Shimizu et al., "Local Mechanical-Stress Control (LMC): A New Technique for CMOS-Performance Enhancement", International Electron Devices Meeting, IEEE, 2001, 19.4.1-19.4.4.

Ota et al., "Novel Locally Strained Channel Technique for High Performance 55nm CMOS", International Electron Devices Meeting, IEEE, 2002, pp. 27-30, 2.2.1-2.2.4.

Zhang et al. "A New 'Mixed-Mode' Reliability Degradation Mechanism in Advanced Si and SiGe Bipolar Transistors", IEEE, 2002, pp. 2151-2156.

Momose et al., "Temperature Dependence of Emitter-Base Reverse Stress Degradation and its Mechanism Analyzed by MOS Structures", IEEE, Paper 6.2, 1989, pp. 140-143.

Huang et al., "Temperature Dependence and Post-Stress Recovery of Hot Electron Degradation Effects in Bipolar Transistors", Bipolar Circuits and technology Meeting 7.5, IEEE, 1991, pp. 170-173.

Sheng et al., "Degradation and Recovery of SiGe HBTs Following Radiation and Hot-Carrier Stressing", pp. 14-15.

Yang et al., "Avalanche Current Induced Hot Carrier Degradation in 200GHz SiGe Heterojunction Bipolar Transistors".

Li et al., "Design of W-Band VCOs with high Output Power for Potential Application in 77GHz Automotive Radar Systems", GaAs Digest, IEEE, 2003, pp. 263-266.

Wurzer et al. "Annealing of Degraded npn-Transistors-Mechanisms and Modeling", Transactions on Electron Devices, IEEE, 1994, pp. 533-538, vol. 41, No. 4.

Doyle et al., "Recovery of Hot-Carrier Damage in Reoxidized Nitrided Oxide MOSFET's" Electron Device Letters, IEEE, 1992, pp. 38-40, vol. 13, No. 1.

Momose et al., "Analysis of the Temperature Dependence of Hot-Carrier-Induced Degradation in Bipolar Transistors for Bi-CMOS", Transactions on Electron Devices, IEEE, 1994, pp. 978-987, vol. 41, No. 6.

Khater et al., "Site HBT Technology with Fmax/Ft=350/300 GHz and Gate Delay Below 3.3 ps", IEEE, 2004.

Bean et al., "GEx Si1-x/Si Strained-Layer Superlattice Grown by Molecular Beam Epitaxy", J. Vac. Sci. Technol., 1984, pp. 436-440, vol. A 2, No. 2.

Van Der Merwe, "Regular Articles", Journal of Applied Physics, 1963, pp. 117-122, vol. 34, No. 1.

Matthews et al., "Defects in Epitaxial Multilayers", Journal of Crystal Growth, 1974, pp. 118-125, vol. 27.

Iyer et al., "Heterojunction Bipolar Transistors Using Si-Ge Alloys", Transactions on Electron Devices, IEEE, 1989, pp. 2043-2064, vol. 36, No. 10.

Van De Leur et al., "Critical Thickness for Pseudomorphic Growth of Si/Ge Alloys and Superlattices", J. Appl. Phys., 1988, pp. 3043-3050, vol. 64, No. 6.

Houghton et al., "Equilibrium Critical Thickness for Si1-xGex Strained Layers on (100) Si", Appl. Phys. Lett., 1990, pp. 460-462, vol. 56, No. 29.

Ouyang et al., "Two-Dimensional Bandgap Engineering in a Novel Si/SiGe pMOSFET With Enhanced Device Performance and Scalability," IEEE, 2000, pp. 151-154.

* cited by examiner

STRESS-GENERATING STRUCTURE FOR SEMICONDUCTOR-ON-INSULATOR DEVICES

This application is a divisional application of U.S. Ser. No. 13/370,898 filed on Feb. 10, 2012 which is a divisional application of U.S. Ser. No. 11/860,851, filed on Sep. 25, 2007. The entire contents of each of the aforementioned U.S. application are incorporated herein by reference.

FIELD OF THE INVENTION

The present invention generally relates to semiconductor structures, and particularly to stress-generating structures for semiconductor-on-insulator (SOI) devices and methods of manufacturing the same.

BACKGROUND OF THE INVENTION

When stress is applied to the channel within an active area of a semiconductor transistor, the mobility of carriers, and as a consequence, the transconductance and the on-current of the transistor are altered from their corresponding values for a transistor containing an unstressed semiconductor. This is because the applied stress and the resulting strain on the semiconductor structure within the channel affects the band gap structure (i.e., breaks the degeneracy of the band structure) and changes the effective mass of carriers. The effect of the stress depends on the crystallographic orientation of the plane of the channel, the direction of the channel within the crystallographic orientation, the direction of the applied stress, and the type of carriers.

The effect of stress on the performance of semiconductor devices, especially on the performance of a metal-oxide-semiconductor field effect transistor (MOSFET, or a "FET" in short) device built on a silicon substrate, has been extensively studied in the semiconductor industry. For a p-type MOSFET (PMOSFET, or a "PFET" in short) utilizing a silicon channel, the mobility of minority carriers in the channel (which are holes in this case) increases under uniaxial compressive stress along the direction of the channel, i.e., the direction of the movement of holes or the direction connecting the drain to the source. Conversely, for an n-type MOSFET (NMOSFET, or an "NFET" in short) devices utilizing a silicon channel, the mobility of minority carriers in the channel (which are electrons in this case) increases under uniaxial tensile stress along the direction of the channel, i.e., the direction of the movement of electrons or the direction connecting the drain to the source. Tensile stress in transverse direction, i.e., the direction perpendicular to the movement of carriers, can enhance both electron and hole mobilities. Thus, performance of field effect transistors may be improved by forming a stress-generating structure in or on a semiconductor substrate.

Methods of employing stress-generating shallow trench isolation liners in a bulk substrate are known in the art. Direct application of such methods to semiconductor-on-insulator substrate results in an insignificant amount of improvement in performance compared to bulk equivalents. This is because the thickness of a top semiconductor layer is much less than a depth of shallow trench isolation in bulk substrates, which may be from about 300 nm to about 450 nm, and the amount of stress transferred to SOI devices is proportional to the thickness of the top semiconductor layer, which may be from about 5 nm to about 30 nm in the case of ultra-thin semiconductor-on-insulator (UTSOI) substrates employed for high performance devices.

In view of the above, there exists a need for an effective stress-generating structure for semiconductor-on-insulator (SOI) devices, and methods of manufacturing the same.

Further, current semiconductor processing sequence used in industry employs silicon oxide as a trench fill material. Modification of an exposed structure of the trench isolation structure would require alterations to subsequent processing steps.

Therefore, there exists a need for an effective stress-generating structure that is compatible with existing semiconductor processing after formation of trench isolation structures, and methods of manufacturing the same.

SUMMARY OF THE INVENTION

The present invention addresses the needs described above by providing a stress-generating structure which is compatible with semiconductor-on-insulator substrates and existing processing after formation of trench isolation structures, and methods of manufacturing the same.

In the present invention, a stack of pad layers including a first pad oxide layer, a pad nitride layer, and a second pad oxide layer are formed on a semiconductor-on-insulator (SOI) substrate. A deep trench extending below a bottom surface of a buried insulator layer of the SOI substrate and enclosing at least one top semiconductor region is formed by lithographic methods and etching. A stress-generating nitride material is deposited in the deep trench and recessed below a top surface of the SOI substrate to form a stress-generating buried nitride plug in the deep trench. A silicon oxide material is deposited in the deep trench, planarized, and recessed. The stack of pad layers is removed to expose substantially coplanar top surfaces of the top semiconductor layer and of silicon oxide plugs. The stress-generating buried nitride plug encloses, and generates either a compressive stress or tensile stress to, the at least one top semiconductor region.

According to an aspect of the present invention, a semiconductor structure is provided which comprises:

a semiconductor-on-insulator (SOI) substrate including a handle substrate, at least one buried insulator portion abutting the handle substrate, and at least one top semiconductor portion abutting the at least one buried insulator portion;

a trench extending from a top surface of the at least one top semiconductor portion to a depth below a top surface of the at least one buried insulator portion; and a stack of an insulator stressor plug and a silicon oxide plug located in the trench, wherein the insulator stressor plug abuts a bottom surface of the trench and the silicon oxide plug is substantially coplanar with the top surface of the at least one top semiconductor portion.

In one embodiment, the trench extends a depth below a bottom surface of the at least one buried insulator portion.

In another embodiment, the insulator stressor plug comprises a silicon nitride and applies a tensile stress or a compressive stress to the at least one top semiconductor portion.

In even another embodiment, a magnitude of the tensile stress or the compressive stress is greater than 0.2 GPa in a region in the at least one top semiconductor portion.

In yet another embodiment, the insulator stressor plug laterally abuts, and encloses, the at least one buried insulator portion.

In still another embodiment, the insulator stressor plug laterally abuts and encloses the at least one top semiconductor portion.

In still yet another embodiment, an interface between the insulator stressor plug and the silicon oxide plug is located between the top surface of the at least one top semiconductor portion and a bottom surface of the at least one top semiconductor portion, or at the bottom surface of the at least one top semiconductor portion.

In a further embodiment, an interface between the insulator stressor plug and the silicon oxide plug is located between a top surface of the at least one buried insulator portion and the bottom surface of the at least one buried insulator portion, or at the bottom surface of the at least one buried insulator portion.

In an even further embodiment, an interface between the insulator stressor plug and the silicon oxide plug is located beneath the bottom surface of the at least one buried insulator portion.

In a yet further embodiment, the at least one top semiconductor layer comprises one of silicon, germanium, a silicon germanium alloy, a silicon carbon alloy, and a silicon germanium carbon alloy.

In a still further embodiment, a thickness of the at least one top semiconductor portion is from about 5 nm to about 300 nm, and wherein a depth of the trench is from about 200 nm to about 8,000 nm.

According to another aspect of the present invention, a method of forming a semiconductor structure is provided, which comprises:

forming a trench extending from a top surface of a semiconductor-on-insulator (SOI) substrate to a depth beneath a bottom surface of a buried insulator layer of the SOI substrate; and forming a stack of an insulator stressor plug and a silicon oxide plug in the trench, wherein the insulator stressor plug abuts a bottom surface of the trench, and wherein the silicon oxide plug is substantially coplanar with a top surface of at least one top semiconductor portion formed in a top semiconductor layer of the SOI substrate.

In one embodiment, the method further comprises:

forming a stack of pad layers directly on the SOI substrate; applying a photoresist on the stack of pad layers and lithographically patterning the photoresist; and transferring a pattern in the resist into the stack of pad layers and the SOI substrate by at least one reactive etch.

In another embodiment, the trench laterally abuts and encloses the at least one top semiconductor portion and at least one buried insulator portion, wherein the at least one buried insulator portion vertically abuts the at least one top semiconductor portion.

In yet another embodiment, the method further comprises:

depositing a silicon nitride into the trench; and recessing the silicon nitride in the trench to form the insulator stressor plug.

In still another embodiment, the insulator stressor plug comprises a silicon nitride and applies a compressive stress or a tensile stress to the at least one top semiconductor portion.

In still yet another embodiment, a magnitude of the tensile stress or the compressive stress exceeds 0.2 GPa in a region in the at least one top semiconductor portion.

In a further embodiment, the method further comprises:

depositing a silicon oxide into the trench on top of the insulator stressor plug; and recessing the silicon oxide in the trench to form the silicon oxide plug.

In an even further embodiment, an interface between the insulator stressor plug and the silicon oxide plug is located between the top surface of the at least one top semiconductor portion and a bottom surface of the at least one top semiconductor portion, or at the bottom surface of the at least one top semiconductor portion.

In a yet further embodiment, an interface between the insulator stressor plug and the silicon oxide plug is located between a top surface of the buried insulator layer and the bottom surface of the buried insulator layer, or at the bottom surface of the buried insulator layer.

In a still further embodiment, a thickness of the at least one top semiconductor portion is from about 5 nm to about 300 nm, and wherein a depth of the trench is from about 200 nm to about 8,000 nm.

Figure 11:
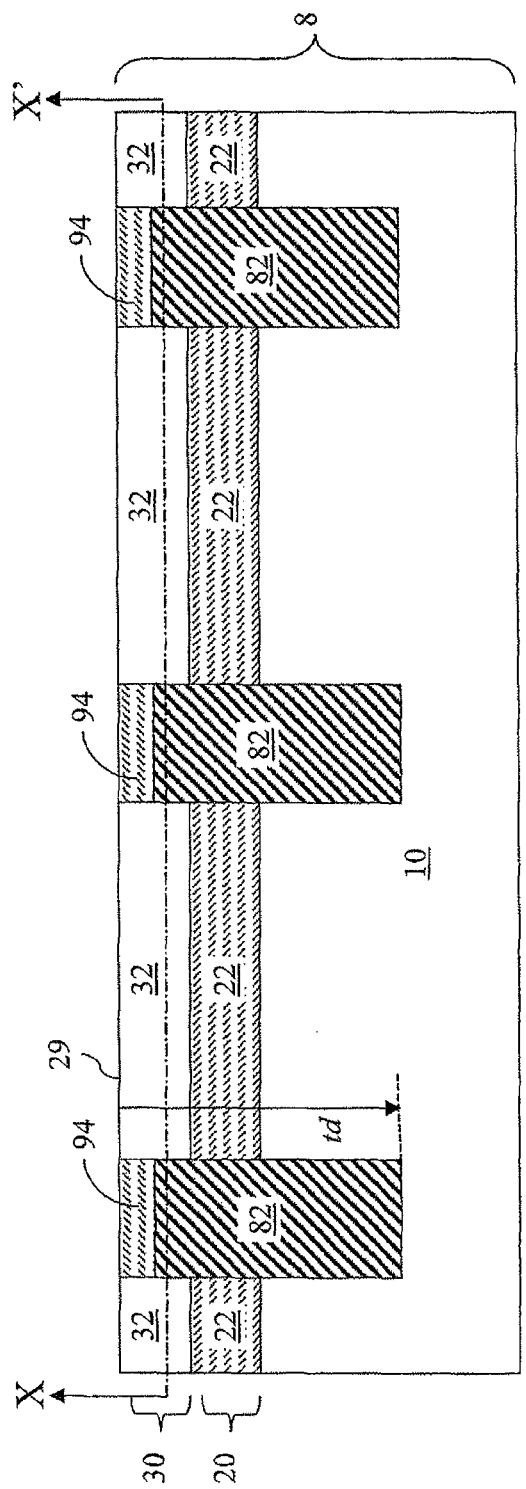
Figure 14:
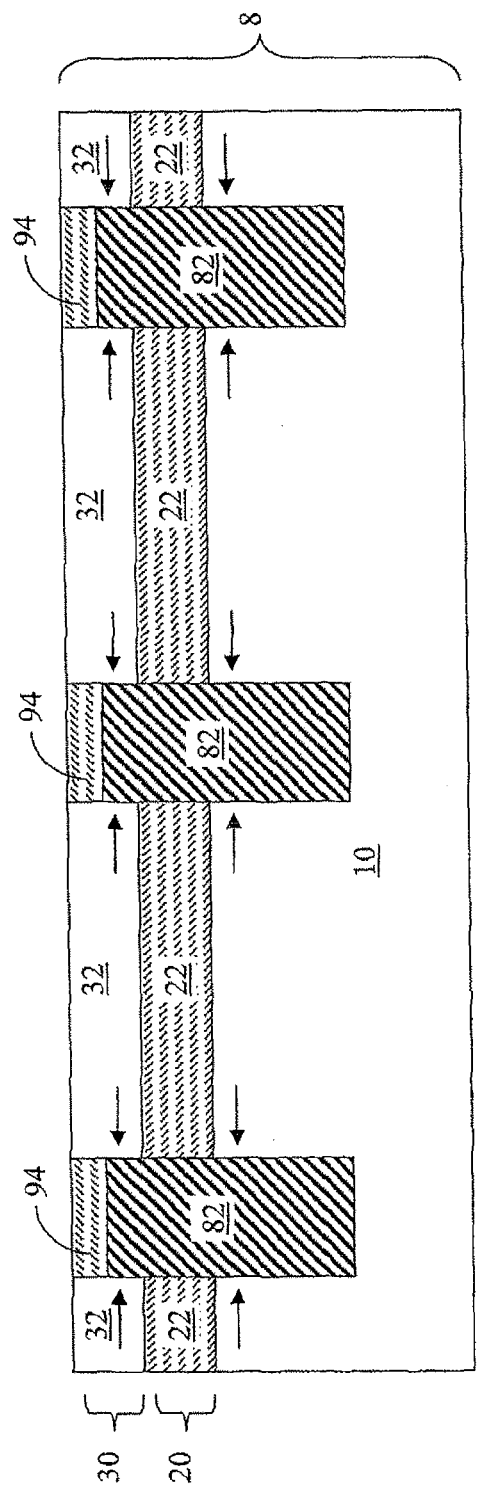
Figure 15:
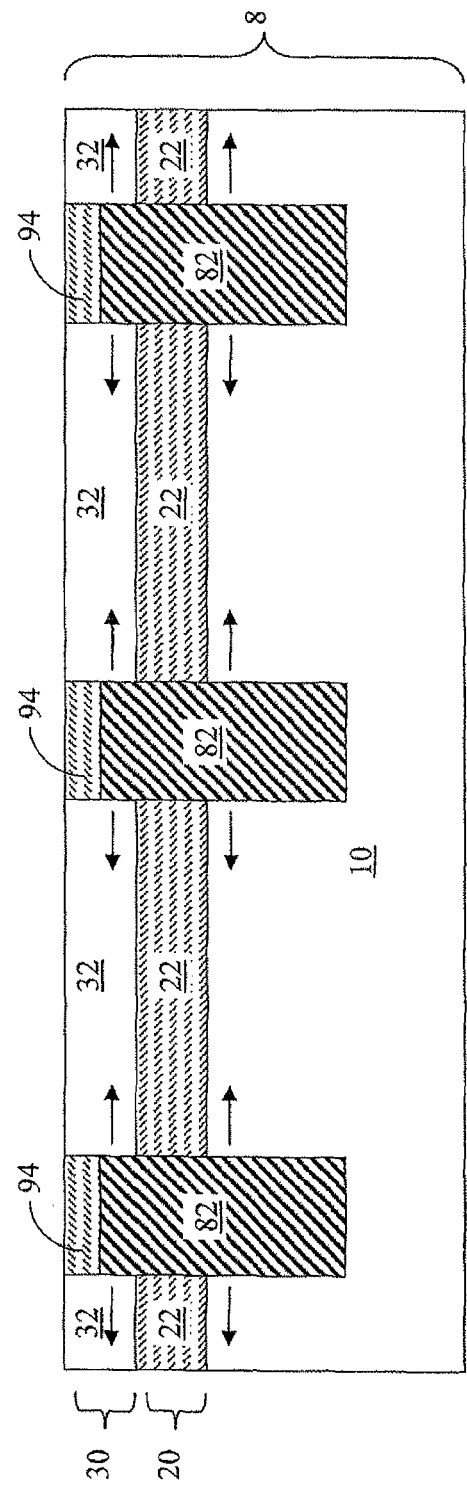

Each of FIGS. 14-15 is a superposition of FIG. 11 with a stress schematic indicating the direction of stress generated by a stress-generating nitride plug.

Figure 16:
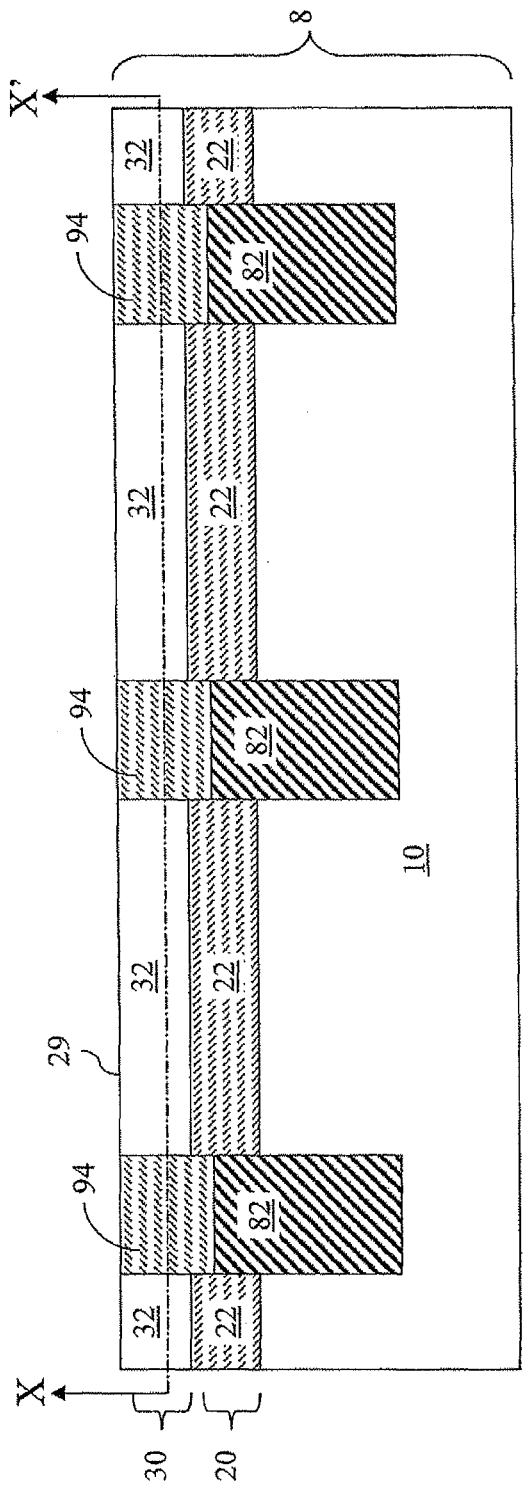

FIG. 16 is a vertical cross-sectional view of a second exemplary semiconductor structure according to the present invention.

Figure 17:
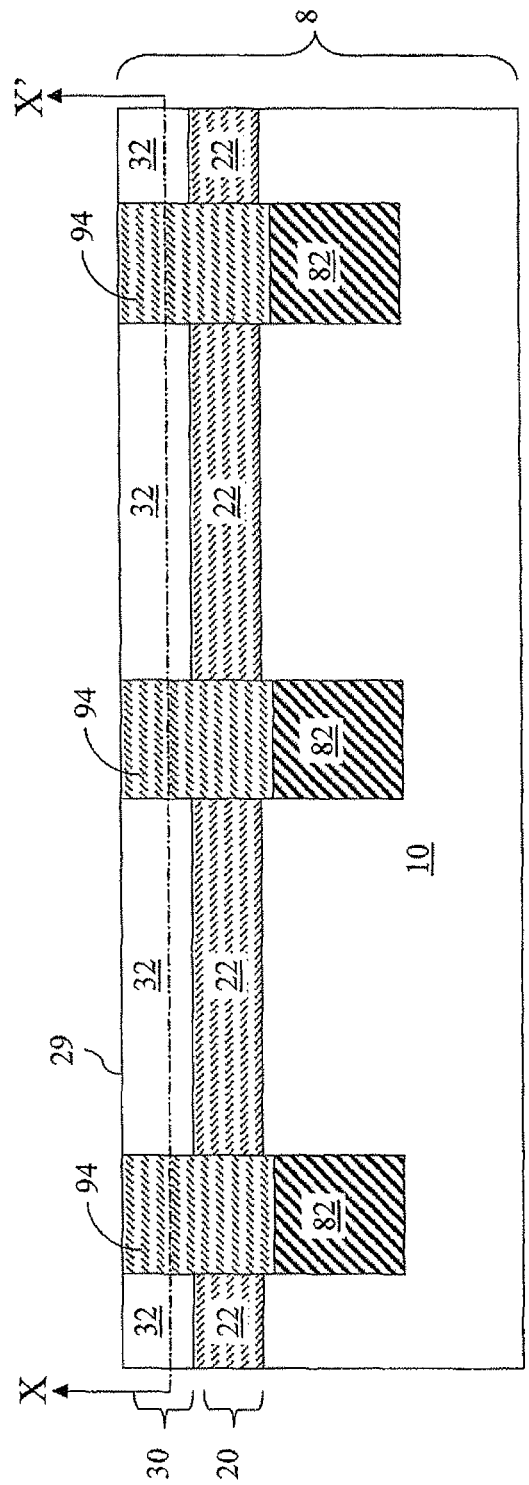

FIG. 17 is a vertical cross-sectional view of a third exemplary semiconductor structure according to the present invention.

Figure 18:
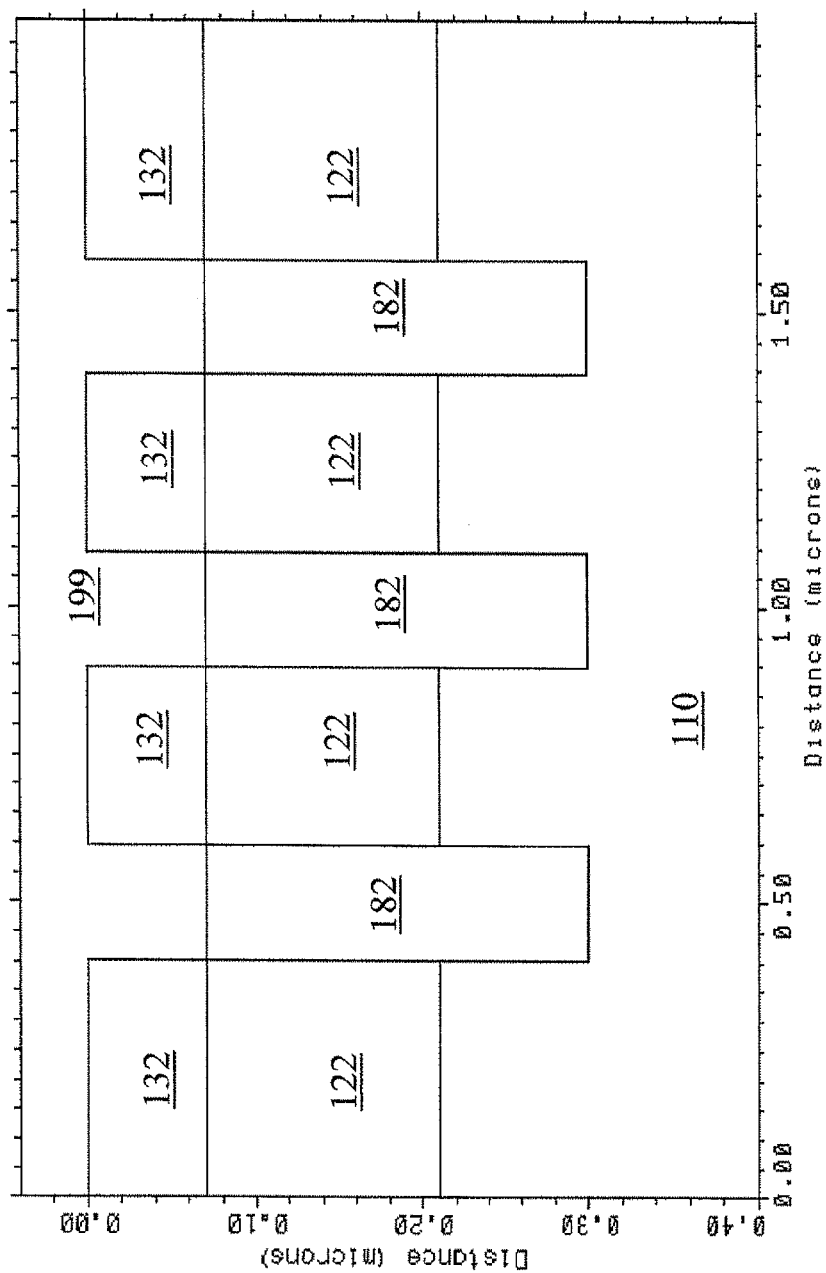

FIG. 18 is a two-dimensional model for simulation of stress in a fourth exemplary semiconductor structure according to the present invention.

Figure 19:
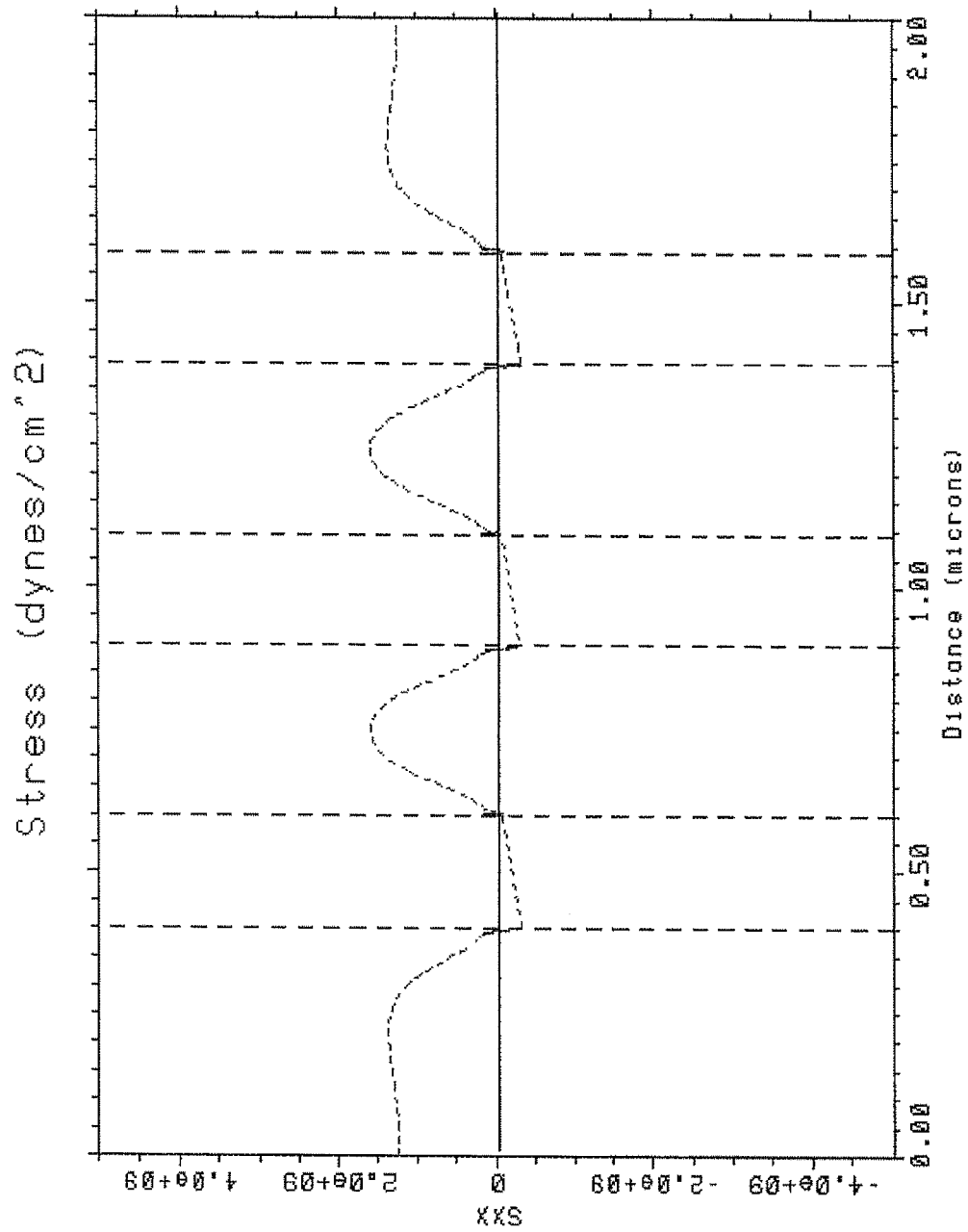

FIG. 19 is a plot of lateral stress from a simulation employing the two-dimensional model of FIG. 15.

DETAILED DESCRIPTION OF THE INVENTION

As stated above, the present invention relates to particularly to stress-generating structures for semiconductor-on-insulator (SOI) devices and methods of manufacturing the same, which are now described in detail with accompanying figures. It is noted that like and corresponding elements are referred to by like reference numerals.

Figure 1:
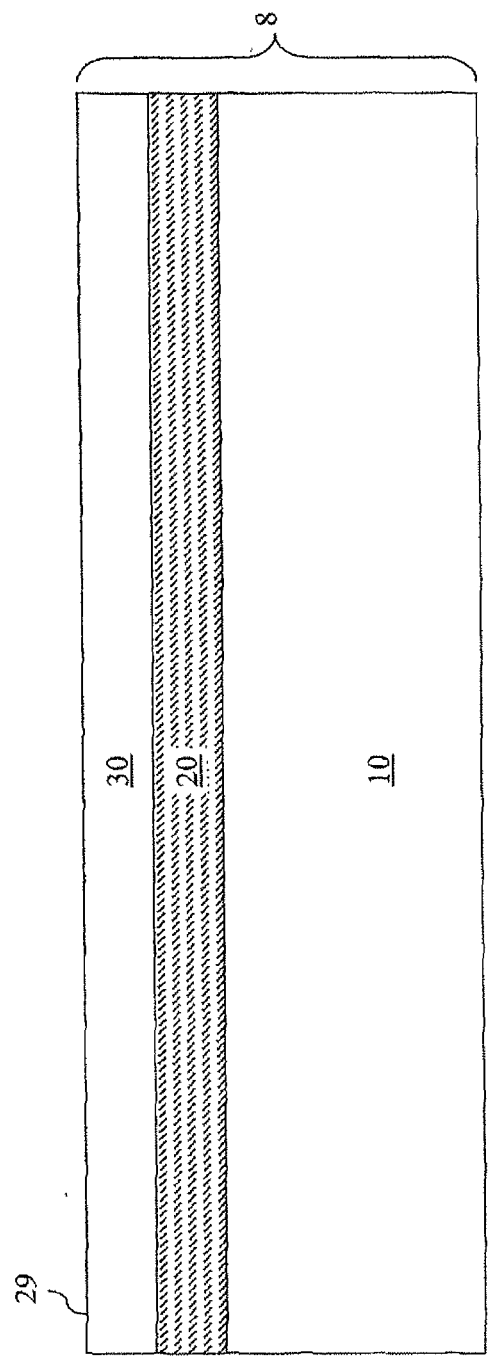
FIGS. 1-3, 5-11 are sequential vertical cross-sectional views of a first exemplary semiconductor structure according to the present invention.

Referring to FIG. 1, a vertical cross-sectional view of a first exemplary semiconductor structure is shown, which comprises a semiconductor-on-insulator (SOI) substrate 8 containing a handle substrate 10, a buried insulator layer 20, and a top semiconductor layer 30. The handle substrate 10 may comprise a semiconductor material such as silicon. Preferably, the handle substrate 10 comprises a single crystalline semiconductor material. The handle substrate 10 may have a p-type doping or an n-type doping. The conductivity of the doping of the handle substrate 10 is herein referred to as a first conductivity type. The dopant concentration of the handle substrate 10 is from about $1.0 \times 10^{14}/cm^3$ to about $3.0 \times 10^{17}/cm^3$, and typically at a dopant concentration from about $1.0 \times 10^{15}/cm^3$ to about $3.0 \times 10^{16}/cm^3$. The buried insulator layer 20 comprises a dielectric material such as a silicon oxide or a silicon nitride. Preferably, the buried insulator layer 20 comprises thermal silicon oxide. The thickness of the buried insulator layer 20 may be from about 50 nm to about 400 nm, and typically from about 100 nm to about 200 nm. Implementation of the present invention on a hybrid substrate containing a bulk portion and an SOI portion is explicitly contemplated herein.

The top semiconductor layer 30 comprises a semiconductor material that may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. The thickness of the top semiconductor layer 30 may be from about 5 nm to about 300 nm, and preferably from about 5 nm to about 100 nm. Preferably, the entirety of the top semiconductor layer 30 comprises a single crystalline semiconductor material.

The top semiconductor layer 30 may have a built-in biaxial stress in the plane of the top semiconductor layer 30, i.e., in the plane perpendicular to the direction of the surface normal of a substrate top surface 29, which is a top surface of the SOI substrate 8. The top semiconductor layer 30 may be substantially undoped of may have a doping of the first conductivity type or a doping of the opposite type of the first conductivity type, which is herein referred to as a second conductivity type. The dopant concentration of the top semiconductor layer 30 may be from about $1.0\times10^{14}/cm^3$ to about $3.0\times10^{17}/cm^3$, and typically from about $1.0\times10^{15}/cm^3$ to about $3.0\times10^{16}/cm^3$, although lesser and greater dopant concentrations are explicitly contemplated herein.

Figure 2:
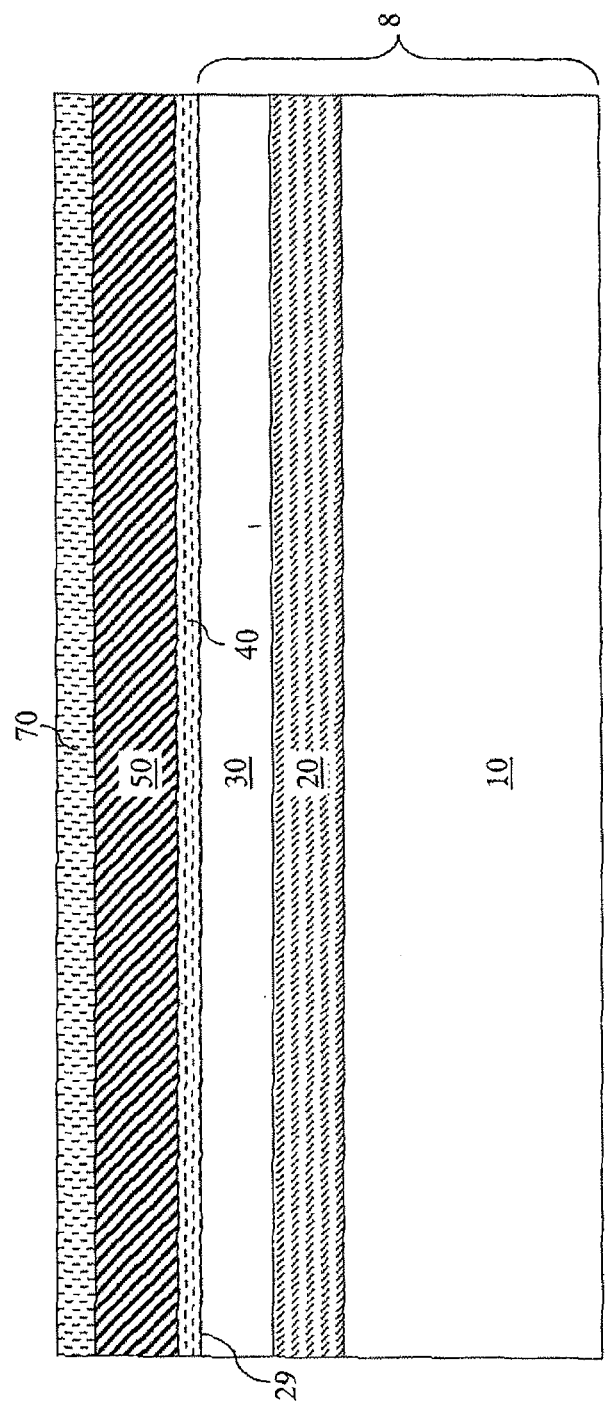

Referring to FIG. 2, a stack of pad layers is formed on the substrate top surface 29. Specifically, a first pad oxide layer 40 is formed directly on the substrate top surface. The first pad oxide layer 40 may comprise a thermal oxide of the semiconductor material in the top semiconductor layer 30, or may comprise a dielectric oxide material deposited by chemical vapor deposition (CVD). The first pad oxide layer 40 may comprise a silicon oxide such as a thermal silicon oxide or a deposited silicon oxide formed by CVD. The thickness of the first pad layer 40 is from about 3 nm to about 30 nm, and typically from about 5 nm to about 15 nm.

A pad nitride layer 50 is deposited on the first pad layer 40, for example, by chemical vapor deposition such as low pressure chemical vapor deposition (LPCVD) or rapid thermal chemical vapor deposition (RTCVD). The pad nitride layer 50 may comprise silicon nitride, or other dielectric nitride having sufficient resistance to chemical mechanical polishing. The thickness of the pad nitride layer 50 may be from about 50 nm to about 250 nm, and typically from about 10 nm to about 20 nm.

A second pad oxide layer 70 is formed on the pad nitride layer 50, for example, by chemical vapor deposition such as low pressure chemical vapor deposition (LPCVD), rapid thermal chemical vapor deposition (RTCVD), or high density plasma chemical vapor deposition (HDPCVD). The second pad oxide layer 70 may comprise silicon oxide or other semiconductor oxide providing sufficient resistance to etching during a subsequent etching of silicon nitride.

The thickness of the second pad oxide layer 70 may be from about 10 nm to about 1,000 nm. The thickness of the second oxide layer 70 depends on a target depth of a trench into the SOI substrate 8 and the nature of etching process employed to form the trench. For example, in case the depth of the trench to be formed, as measured from the substrate top surface to a bottom of the trench, is from about 200 nm to about 500 nm, and a soft mask process, in which the photoresist 71 is present throughout the etching process, the thickness of the second pad oxide layer may be from about 10 nm to about 100 nm. In case the depth of the trench to be formed is from about 500 nm to about 8,000 nm, and a hard mask process, in which the photoresist 71 is consumed or removed during the etching process and the second pad oxide layer 70 as patterned is employed as an etch mask, the thickness of the second pad oxide layer may be from about 50 nm to about 1,000 nm.

Figure 3:
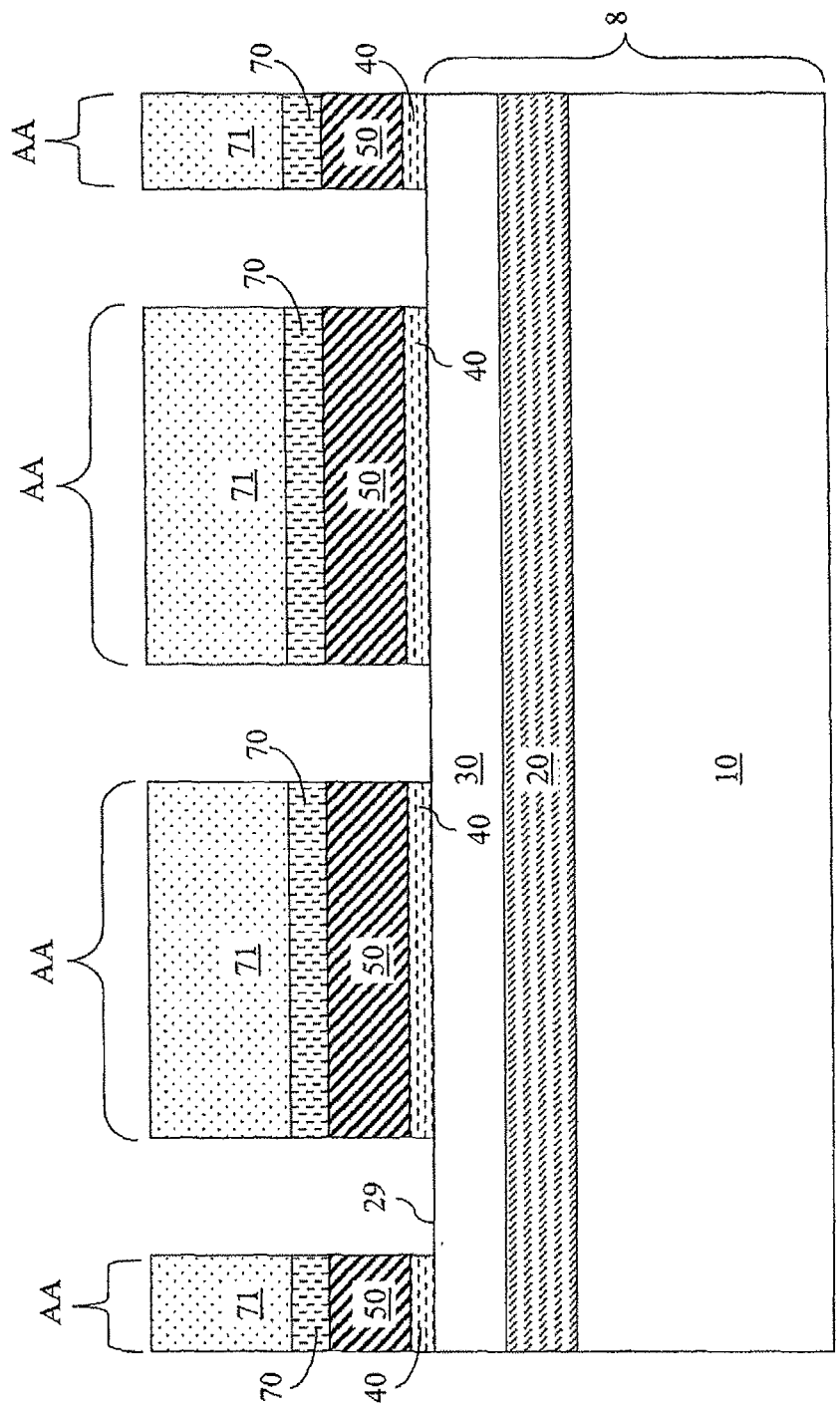
Figure 4:
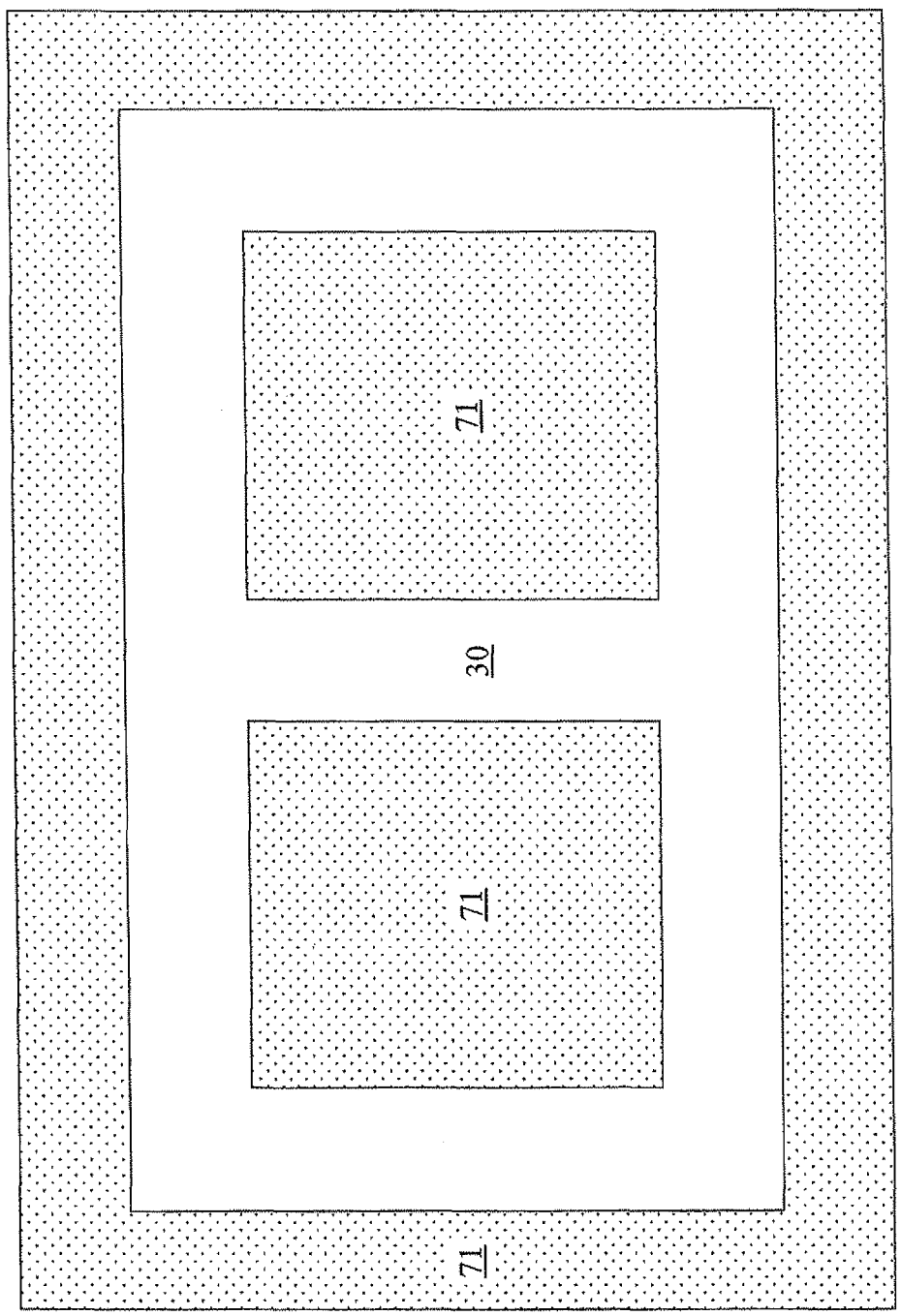
FIG. 4 is a top-down view of the exemplary semiconductor structure in FIG. 4.

Referring to FIGS. 3 and 4, a photoresist 71 is applied onto the top surface of the second pad layer and is lithographically patterned to define active areas AA, within which semiconductor devices are subsequently formed. FIG. 3 is a vertical cross-sectional view and FIG. 4 is a top down view of the first exemplary semiconductor structure. The active areas AA correspond to areas in which the photoresist 71 remains after patterning. Typically, each of the active areas AA is disjoined from other active areas, i.e., an area devoid of the photoresist 71 encloses each of the active areas AA. The complement of the set of all active areas AA, i.e., the area without the photoresist 71, may be a single contiguous area, or may be multiple disjoined areas.

A reactive ion etch is employed to transfer the pattern in the photoresist 71 into the stack of the second pad oxide layer 70, the pad nitride layer 50, and the first pad oxide layer 40, exposing the substrate top surface 29 between the active areas AA. The photoresist 71 may, or may not, be removed at this point depending on the depth of the trench to be subsequently formed and the etch chemistry to be employed therein.

Figure 5:
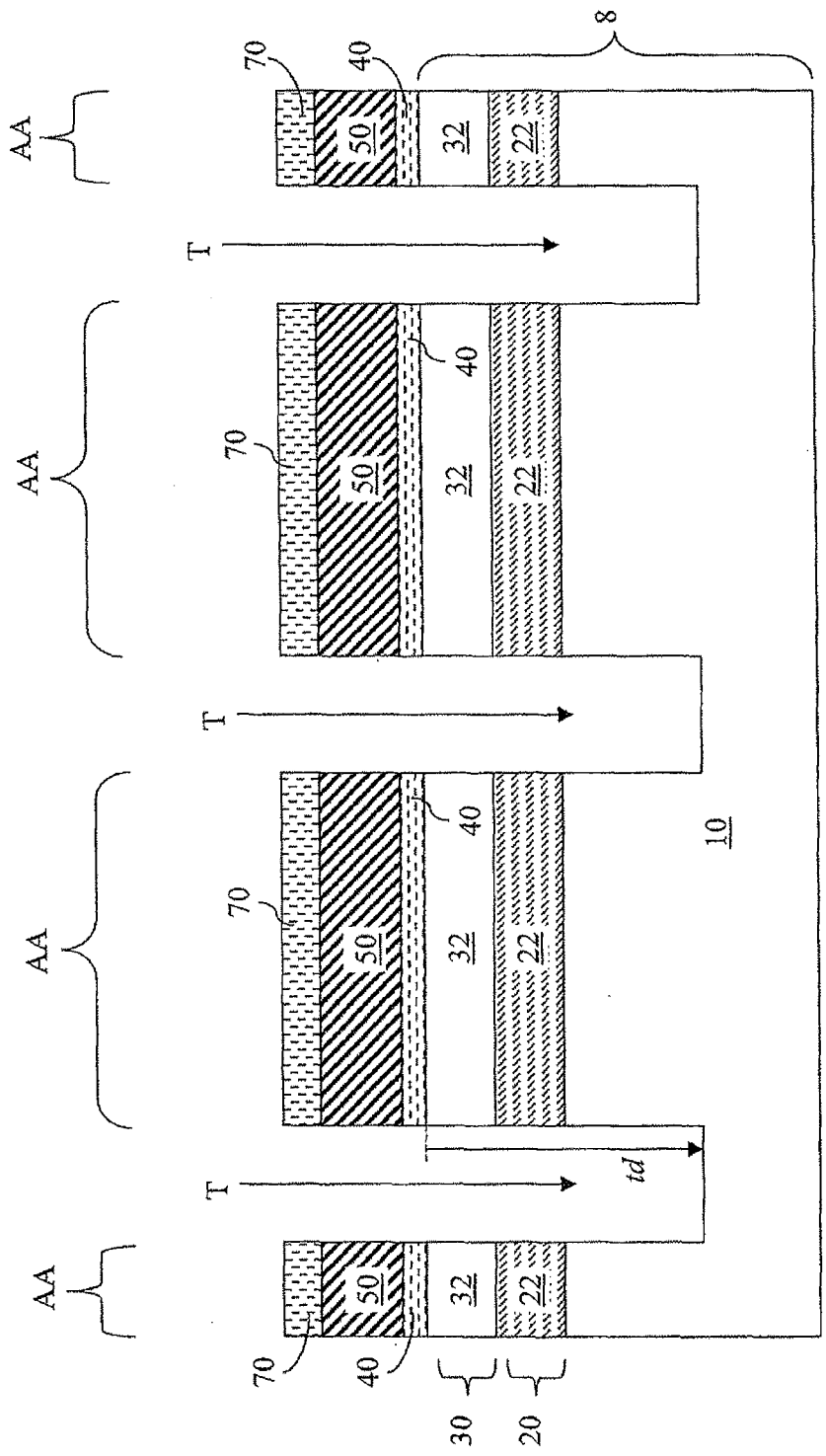

Referring to FIG. 5, the pattern in the photoresist 71 or in the second pad oxide layer 70 is transferred into the SOI substrate 8 by a reactive ion etch to a trench depth td from the substrate top surface 29 into the SOI substrate 8. The trench depth td is greater than the depth of a bottom surface of the buried insulator layer 20 as measured from the substrate top surface 29. The trench depth td may be from about 200 nm to about 8,000 nm. In case the complement of the set of all active areas AA is a single contiguous area, a single trench T is formed. In case the complement of the set of all active areas AA comprises multiple disjoined areas, a plurality of disjoined trenches is formed. Construction of a plurality of disjoined trenches requires modification of the pattern in the photoresist 71, which is known to one of ordinary skill in the art.

At least one top semiconductor portion 32 enclosed by the trench T is formed from remaining portions of the top semiconductor layer 30. The collection of all of the at least one top semiconductor portion 32 constitutes the top semiconductor layer 30. At least one buried insulator portion 22 enclosed by the trench T is formed from remaining portions of the buried insulator layer 20. The collection of all of the at least one buried insulator layer 22 constitutes the buried insulator layer 20. Each of the at least one top semiconductor portion 32 vertically abuts one of the at least one buried insulator portion 22. The sidewalls of each of the at least one top semiconductor portion 32 and sidewalls of the buried insulator portion 22 directly underneath are vertically coincident, i.e., coincident in a vertical view such as a top-down view.

Figure 6:
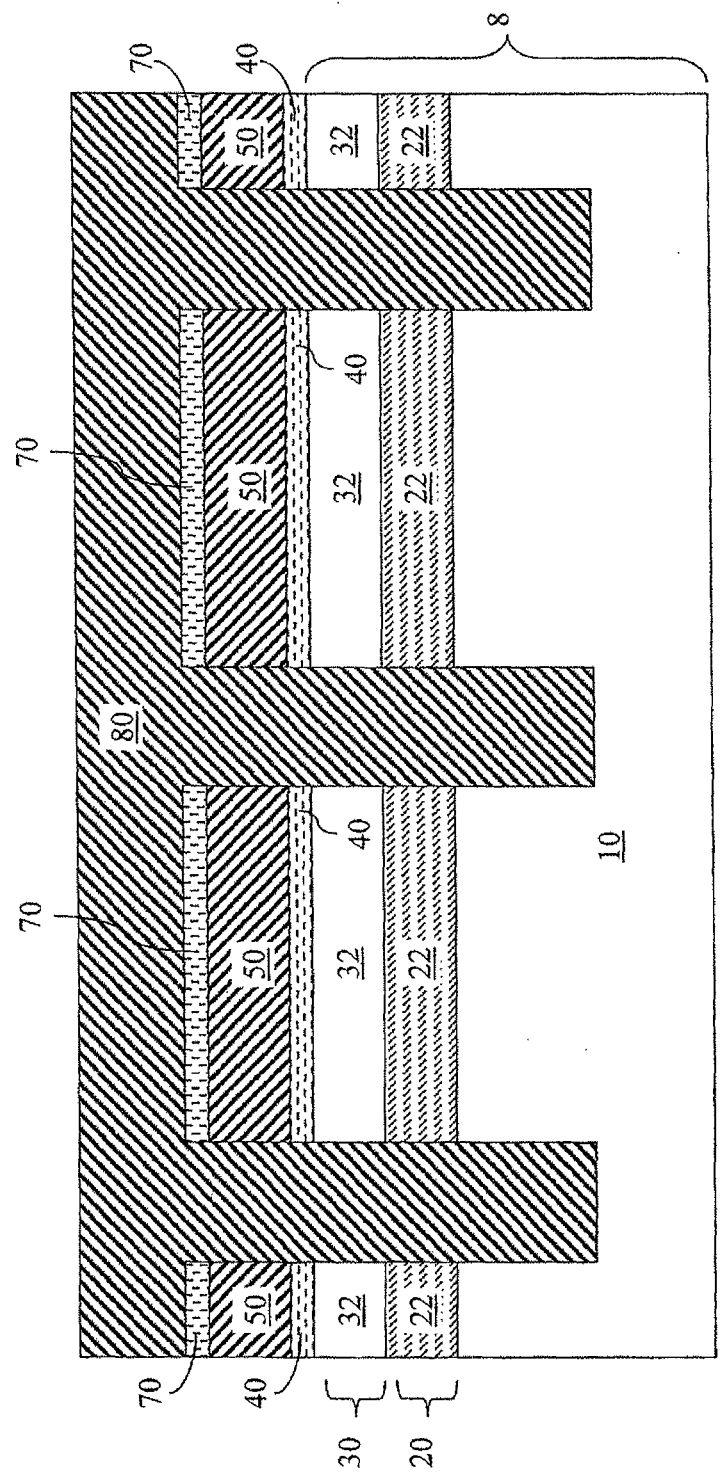

Referring to FIG. 6, a silicon nitride layer 80 is deposited in the trench T (See FIG. 5) and on the second pad oxide layer 70. The trench T is filled with the silicon nitride layer 80. Preferably, the silicon nitride layer 80 comprises a stress-generating silicon nitride, which may be the same material as stress-generating silicon nitride liners formed over a gate electrode as known in the art. Such stress-generating silicon nitride liners of the prior art, having a typical thickness from about 30 nm to about 80 nm, are known to generate compressive stress or tensile stress, of which the magnitude may exceed 0.2 GPa. The difference between the prior art and the present invention is that such stress-generating silicon nitride is formed above a top surface of a semiconductor substrate over a gate electrode in the prior art, while the stress-generating silicon nitride is located in a trench formed beneath the substrate top surface 29 prior to formation of any gate electrode.

As such, the stress-generating silicon nitride may be a tensile stress-generating silicon nitride or a compressive stress-generating silicon nitride. The portion of the silicon nitride layer 80 within the trench T exerts a compressive stress or a tensile stress to structures that the trench T encloses, which include the at least one top semiconductor portion 32, the at least one buried insulator portion 22, and the portion of the handle substrate 10 between a bottom surface of the buried insulator layer 20 and a bottom surface of the trench T. The magnitude of the compressive stress or the tensile stress may be greater than 0.2 GPa in a region of each of the at least one top semiconductor portion 32. In practice, the region in which the magnitude of the compressive stress or the tensile stress exceeds 0.2 GPa may include most of each of the at least one top semiconductor potion 32 except for a boundary region of each of the at least one top semiconductor portion 32 directly on the trench T.

The thickness of the silicon nitride layer 80, as measured above the second pad oxide layer 70, is greater than half of the narrowest distance in the opening of the trench T to insure complete fill of the trench. Consequently, the thickness of the silicon nitride layer is greater than half of the critical dimension, i.e., the minimum dimension that lithographic tools may print. The critical dimension is reduced with each generation of lithographic tools, and is about 50 nm as of 2007. The thickness of the silicon nitride layer 80 may be from about 25 nm to about 300 nm, and preferably from about 25 nm to about 150 nm, although lesser and greater thicknesses are also explicitly contemplated herein.

The stress-generating silicon nitride employed for the silicon nitride layer 80 may be formed by chemical vapor deposition (CVD) such as plasma enhanced chemical vapor deposition (PECVD), high density plasma chemical vapor deposition (HDPCVD), rapid thermal chemical vapor deposition (RTCVD), low pressure chemical vapor deposition (LPCVD), or a combination thereof.

Figure 7:
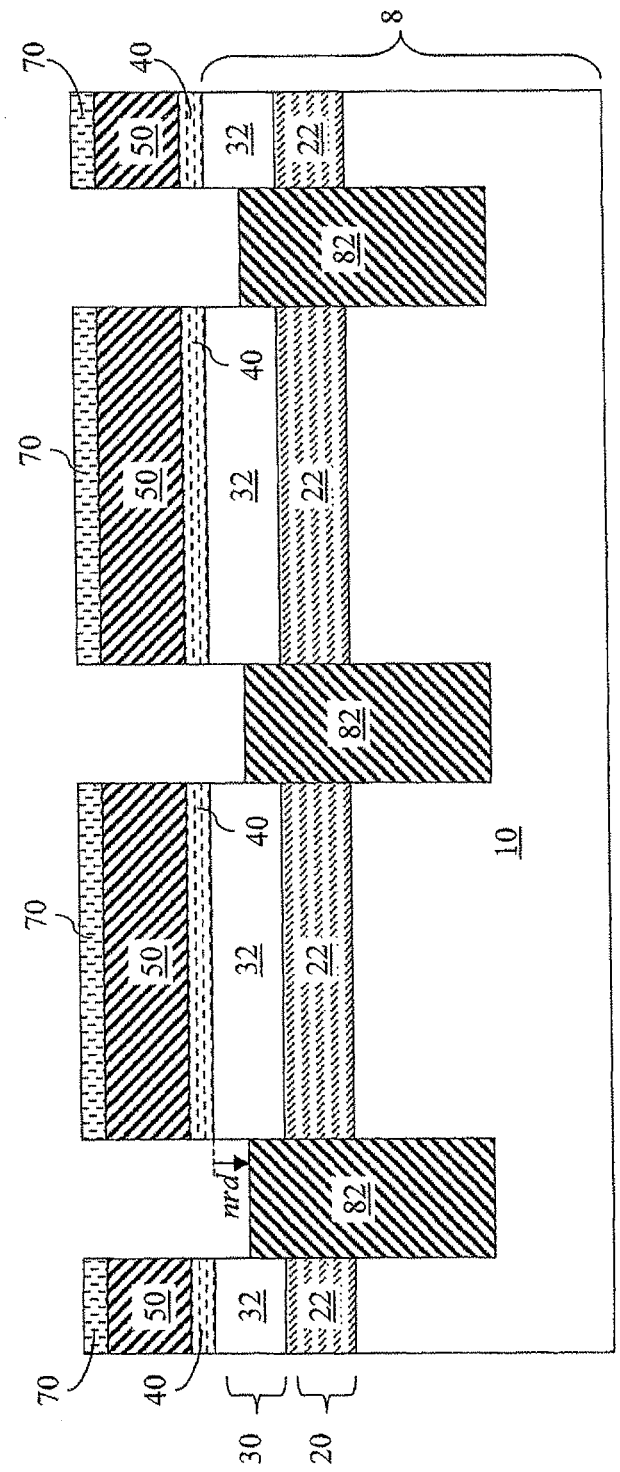

Referring to FIG. 7, the silicon nitride layer 80 (See FIG. 6) is recessed below a top surface of the at least one top semiconductor portion 32. The depth of recess as measured from the top surface of the at least one top semiconductor portion 32, which is herein referred to as a nitride recess depth nrd, may be less than the thickness of the at least one top semiconductor portion 32 so that the top surface of an insulator stressor plug 82, which is the remaining portion of the silicon nitride layer 80, is located between the top surface of the at least one top semiconductor portion 32 and a bottom surface of the at least one top semiconductor portion 32. Alternately, the nitride recess depth nrd, may be equal to the thickness of the at least one top semiconductor portion 32 so that the top surface of the insulator stressor plug 82 is at the depth of the bottom surface of the at least one top semiconductor portion 32. Even alternately, the nitride recess depth nrd may be greater than the thickness of the at least one top semiconductor portion 32 and less than the sum of the thickness of the at least one top semiconductor portion 32 and the thickness of the at least one buried insulator portion 22 so that the top surface of an insulator stressor plug 82 is located between a top surface of the at least one buried insulator portion 22 and a bottom surface of the at least one buried insulator portion 22. Yet alternately, the nitride recess depth nrd, may be equal to the sum of the thickness of the at least one top semiconductor portion 32 and the thickness of the at least one buried insulator portion 22 so that the top surface of the insulator stressor plug 82 is at the depth of the bottom surface of the at least one buried insulator portion 22. Still alternately, the nitride recess depth nrd may be greater than the sum of the thickness of the at least one top semiconductor portion 32 and the thickness of the at least one buried insulator portion 22 so that the top surface of an insulator stressor plug 82 is located beneath the bottom surface of the at least one buried insulator portion 22.

An etch process that etches the silicon nitride layer 80 selective to the second pad oxide layer 70 is employed. Preferably, the etch process is a reactive ion etch (RIE) process in which the etch ratio between the silicon nitride layer 80 and the second pad oxide layer 70 is high, so that at least a portion of the second pad oxide layer 70 remains at the end of the reactive ion etch.

Figure 8:
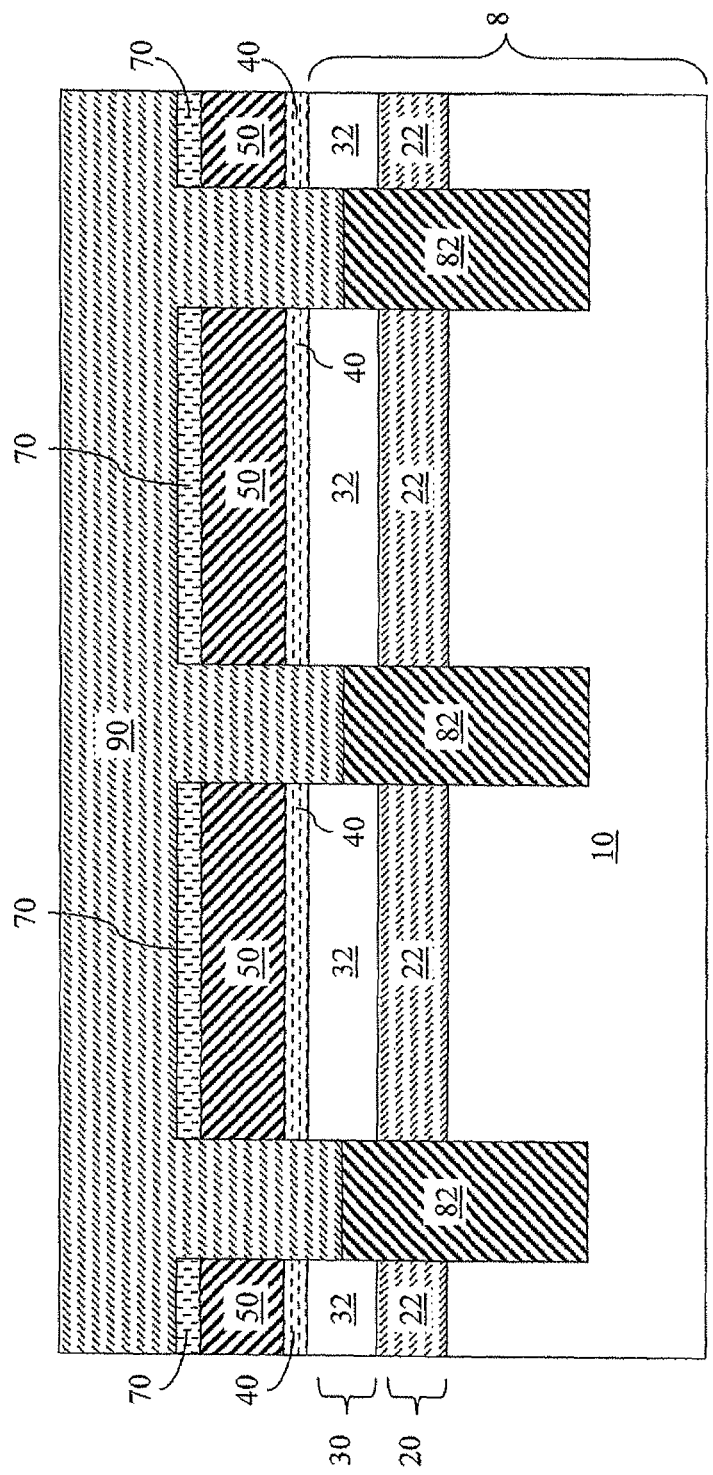

Referring to FIG. 8, a silicon oxide layer 90 is deposited on the insulator stressor plug 82 in the trench T (See FIG. 5) and on the second pad oxide layer 70. The portion of the trench T above the insulator stressor plug 82 is filled with the silicon oxide layer 90.

The silicon oxide layer 90 may be formed by chemical vapor deposition (CVD) such as plasma enhanced chemical vapor deposition (PECVD), high density plasma chemical vapor deposition (HDPCVD), rapid thermal chemical vapor deposition (RTCVD), low pressure chemical vapor deposition (LPCVD), or a combination thereof. A precursor containing silicon and oxygen, such as tetra-ethyl-ortho-silicate (TEOS) may be employed in the CVD process. The silicon oxide layer 90 may, or may not, comprise the same material as the second pad oxide layer 70.

The thickness of the silicon oxide layer 90, as measured above the second pad oxide layer 70, is greater than half of the narrowest distance in the opening of the trench T to insure complete fill of the trench without a void. Consequently, the thickness of the silicon nitride layer is greater than half of the critical dimension. The thickness of the silicon oxide layer 90 may be from about 25 nm to about 300 nm, and preferably from about 25 nm to about 150 nm, although lesser and greater thicknesses are also explicitly contemplated herein.

Figure 9:
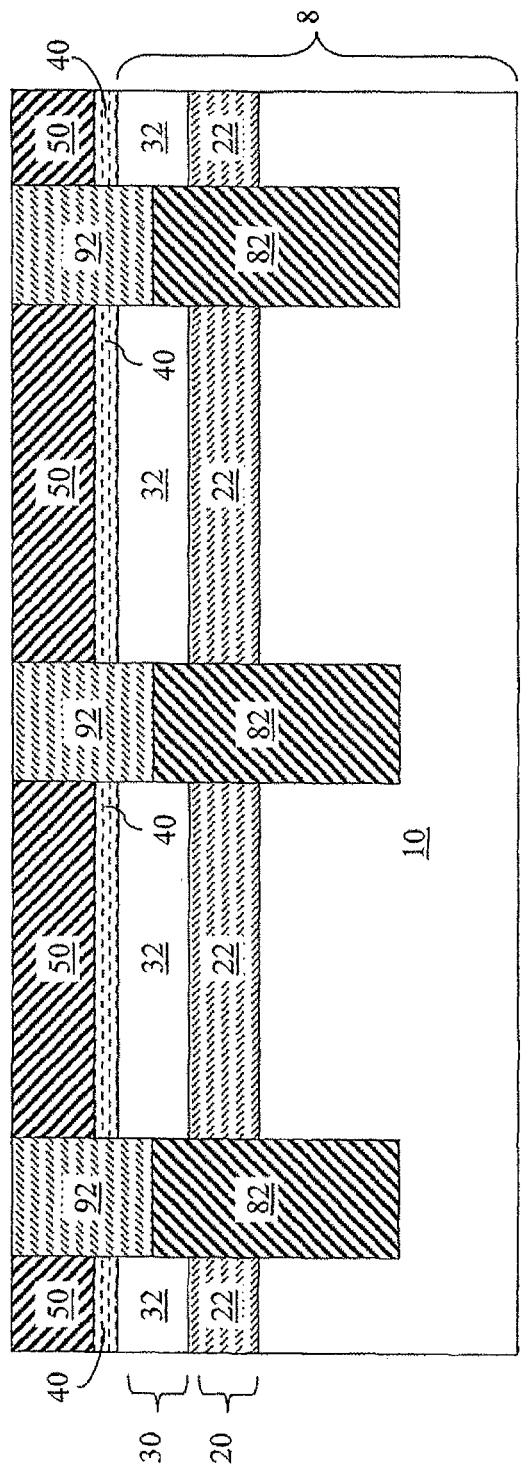

Referring to FIG. 9, the silicon oxide layer 90 is planarized by chemical mechanical polishing (CMP) employing the pad nitride layer 50 as a stopping layer. Optionally, a recess etch, which may be a reactive ion etch, a wet etch, a chemical downstream etch, or any combination thereof, may be employed in conjunction with the chemical mechanical polishing. Methods of performing a CMP process on a silicon oxide layer employing a nitride layer as the stopping layer are well known in the art. The remaining portion of the silicon oxide layer 90 after the CMP step constitutes a planarized silicon oxide layer 92. A top surface of the planarized silicon oxide layer 92 is substantially coplanar with a top surface of the pad nitride layer 50.

Figure 10:
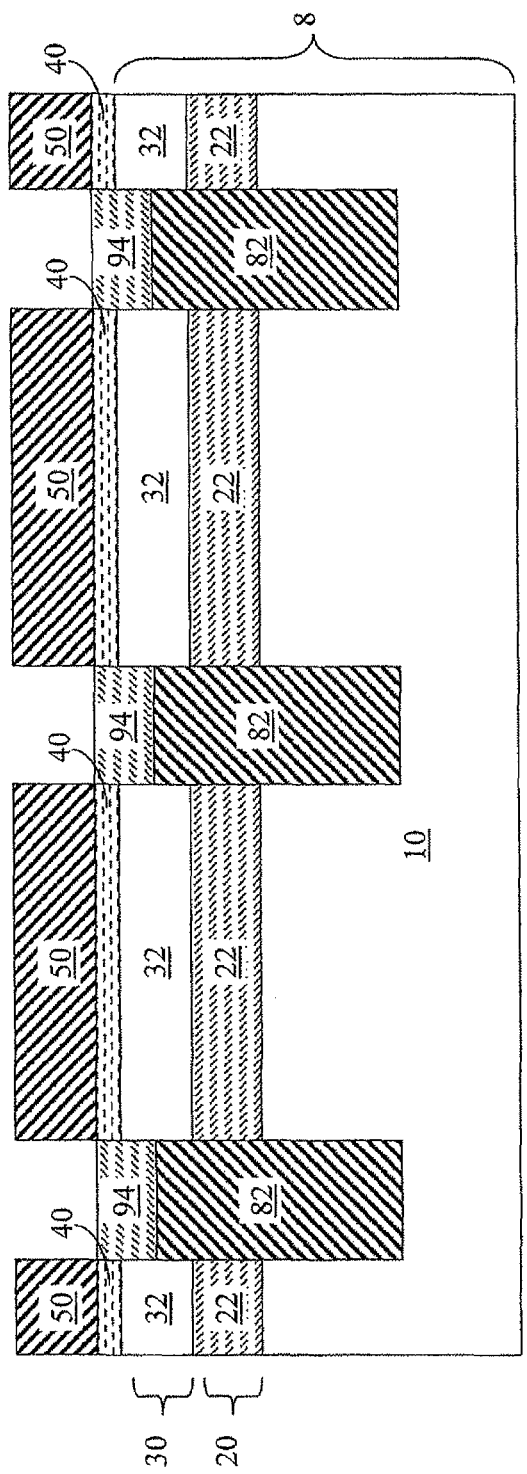

Referring to FIG. 10, the planarized silicon oxide layer 92 is recessed by a first etch that etches the planarized silicon oxide layer 92 selective to the pad nitride layer 50. The first etch may be a wet etch, a reactive ion etch, a chemical dry etch, or any combination thereof. An exemplary wet etch process is a wet etch employing hydrofluoric acid (HF), which selectively etches the planarized silicon oxide layer 92 relative to the pad nitride layer 50. The remaining portion of the planarized silicon oxide layer 92 after the etch constitutes a silicon oxide plug 94. Preferably, a top surface of the silicon oxide plug 94 is located about the interface between the first pad oxide layer 40 and the pad nitride layer 50.

Figure 12:
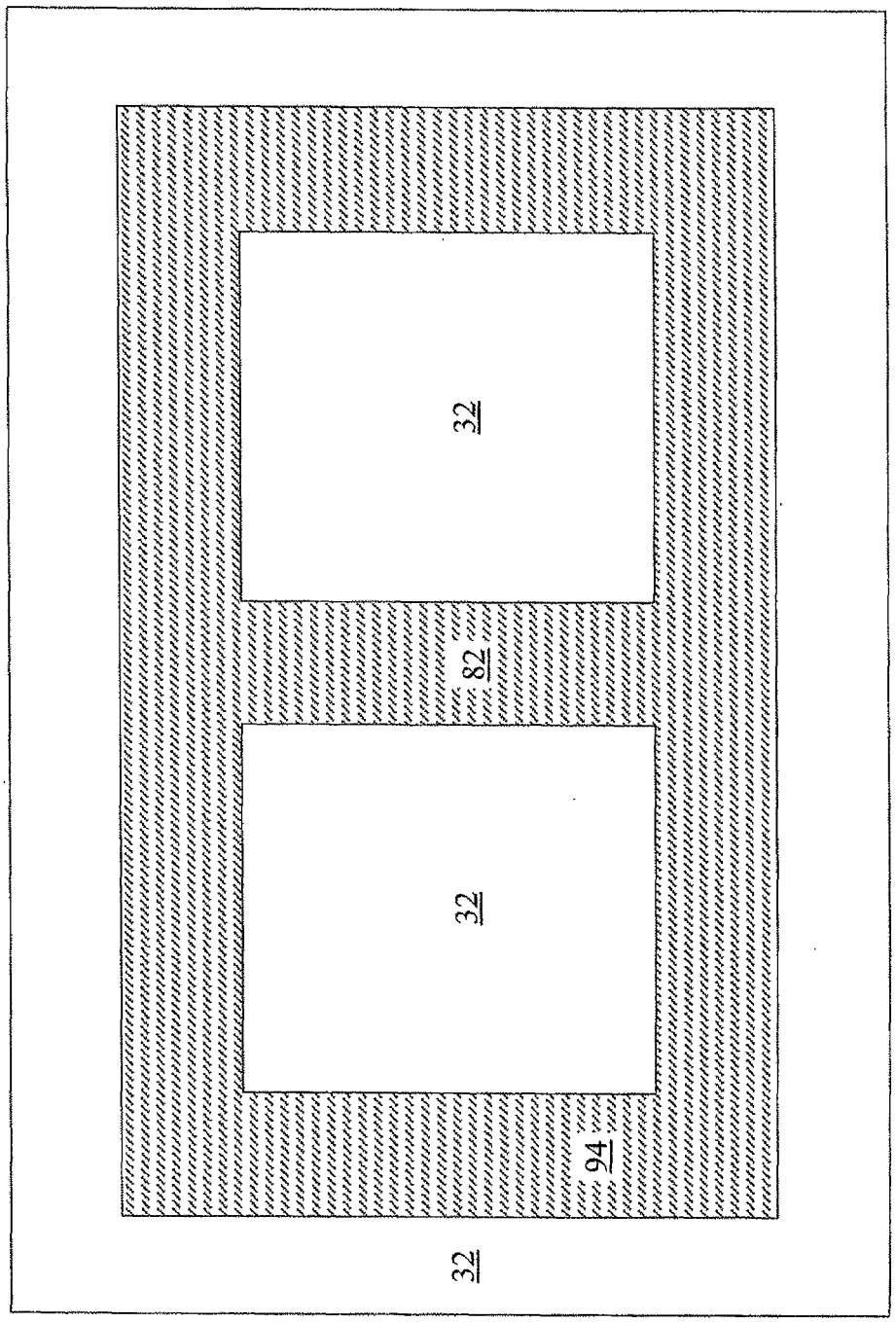
FIG. 12 is a top-down view of the exemplary semiconductor structure in FIG. 11.
Figure 13:
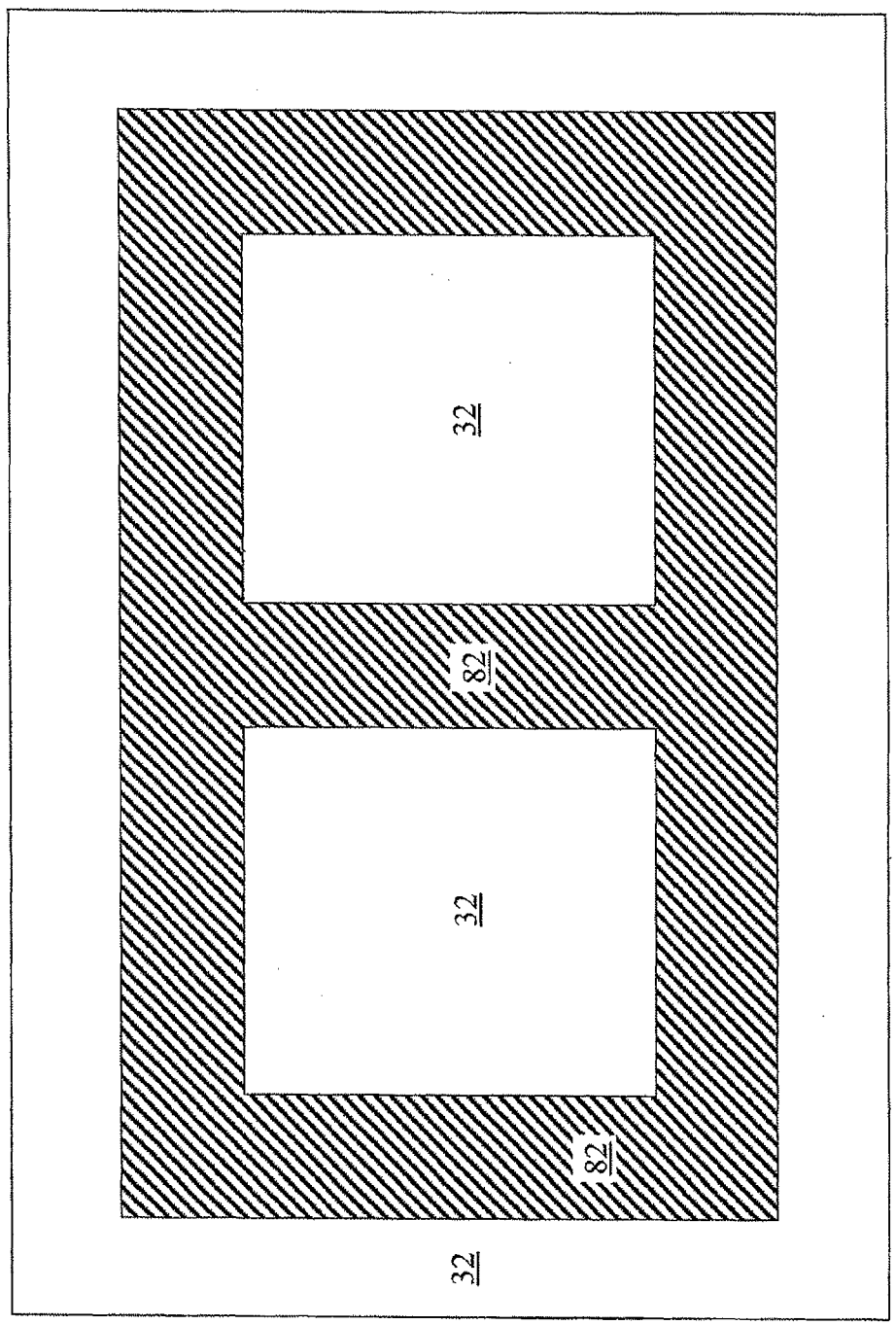
FIG. 13 is a horizontal cross-sectional view of the exemplary semiconductor structure in FIG. 11 along the plane X-X'.

Referring to FIGS. 11-13, the pad nitride layer 50, the first pad oxide layer 40, and a top portion of the silicon oxide plug 94 are removed. FIG. 11 is a vertical cross-sectional view of the first exemplary semiconductor structure. FIG. 12 is a top-down view of the first exemplary semiconductor structure in FIG. 11. FIG. 13 is a horizontal cross-sectional view of the first exemplary semiconductor structure in FIG. 11 along the plane X-X'.

Specifically, the pad nitride layer 50 is removed selective to the silicon oxide plug 94 and the first pad oxide layer 40 by a second etch, which may be a wet etch, a reactive ion etch, a chemical dry etch, or any combination thereof. In case the pad nitride layer 50 comprises silicon nitride, a wet etch employing hot phosphoric acid may be employed to selectively remove the pad nitride layer 50, while not affecting the silicon oxide plug 94 and the first pad oxide layer 40.

The first pad oxide layer 40 and a top portion of the silicon oxide plug 94 may then be removed by a third etch selective to the at least one top semiconductor portion 32. The third etch may be, for example, a wet etch employing hydrofluoric acid (HF). Preferably, amount of removal of the top portion of the silicon oxide plug 92 is such that a top surface of the silicon oxide plug 94 is substantially coplanar with the top surface of the at least one top semiconductor portion 32.

The first exemplary semiconductor structure of FIGS. 11-13 comprises:

a semiconductor-on-insulator (SOI) substrate 8 including a handle substrate 10, at least one buried insulator portion 22 abutting the handle substrate 10, and at least one top semiconductor portion 32 abutting the at least one buried insulator portion 22;

a trench extending from a top surface, which is the substrate top surface 29, of the at least one top semiconductor portion 32, to a depth, which is the trench depth td, below a bottom surface of the at least one buried insulator portion 22; and a stack of an insulator stressor plug 82 and a silicon oxide plug 94 located in the trench, wherein the insulator stressor plug 82 abuts a bottom surface of the trench and the silicon oxide plug 94 is substantially coplanar with the top surface, which is the substrate top surface 29, of the at least one top semiconductor portion 32.

In the first exemplary semiconductor structure, an interface between the insulator stressor plug 82 and the silicon oxide plug 94 is located between the top surface, which is the substrate top surface 29, of the at least one top semiconductor portion 32 and a bottom surface of the at least one top semiconductor portion 32.

The first exemplary semiconductor structure provides a substantially flat top surface, which is the substrate top surface 29, over the entirety of the SOI substrate 8. Further, the substrate top surface 29 comprises a semiconductor material of the at least one semiconductor portion 32 and silicon oxide of the silicon oxide plug 94. This composition is identical to the composition of a top surface of a conventional complementary metal-oxide-semiconductor (CMOS) structure after formation of shallow trench isolation. Thus, the first exemplary semiconductor structure may employ identical processing steps after the processing step of FIGS. 11-13 as conventional CMOS structures. In other words, the first exemplary semiconductor structure is compatible with conventional semiconductor processing sequence after the step of FIGS. 11-13.

Referring to FIG. 14, a stress schematic indicating the direction of stress generated by the insulator stressor plug 82 is shown in superposition on the first exemplary semiconductor structure of FIG. 11 for the case in which the insulator stressor plug 82 generates a tensile stress. The tensile stress is applied to the handle substrate 10 and to the at least one top semiconductor portion 32. A semiconductor device may be formed in the at least one top semiconductor portion 32 such that the tensile stress applied to the at least one top semiconductor portion 32 is advantageously utilized to enhance performance of the semiconductor device. For example, the at least one top semiconductor portion 32 may comprise silicon and the semiconductor device may be an n-type field effect transistor having a channel in the direction of the lateral tensile stress and employing electrons as charge carriers. In this case, the mobility of the electrons increases as a result of the lateral tensile stress on the at least one top semiconductor layer 32.

Referring to FIG. 15, a stress schematic indicating the direction of stress generated by the insulator stressor plug 82 is shown in superposition on the first exemplary semiconductor structure of FIG. 11 for the case in which the insulator stressor plug 82 generates a compressive stress. The compressive stress is applied to the handle substrate 10 and to the at least one top semiconductor portion 32. A semiconductor device may be formed in the at least one top semiconductor portion 32 such that the compressive stress applied to the at least one top semiconductor portion 32 is advantageously utilized to enhance performance of the semiconductor device. For example, the at least one top semiconductor portion 32 may comprise silicon and the semiconductor device may be an p-type field effect transistor having a channel in the direction of the lateral compressive stress and employing holes as charge carriers. In this case, the mobility of the holes increases as a result of the lateral compressive stress on the at least one top semiconductor layer 32.

Referring to FIG. 16, a second exemplary semiconductor structure according to the present invention is shown. The interface between the insulator stressor plug 82 and the silicon oxide plug 94 is located between a top surface of the at least one buried insulator portion 22 and the bottom surface of the at least one buried insulator portion 22.

Referring to FIG. 17, a third exemplary semiconductor structure according to the present invention is shown. The interface between the insulator stressor plug 82 and the silicon oxide plug 94 is located beneath the bottom surface of the at least one buried insulator portion 22.

Embodiments in which the interface between the insulator stressor plug 82 and the silicon oxide plug 94 is located at the bottom surface of the at least one top semiconductor portion 32 or at the bottom surface of the at least one buried insulator portion 22 are explicitly contemplated herein.

Referring to FIG. 18, a two-dimensional model for simulation of stress in a fourth exemplary semiconductor structure according to the present invention. In this two-dimensional model, the structure of the fourth exemplary semiconductor in the direction perpendicular to the plane of the model, i.e., the plane of FIG. 18, is assumed to continue indefinitely, i.e., sufficiently long enough not to affect the results of the simulation.

The cross-sectional area of a handle substrate 10 (See FIG. 11) is approximated by a handle substrate area 110. The cross-sectional area of an insulator stressor plug 82 (See FIG. 11) is approximated by an insulator stressor plug area 182. The cross-sectional area of at least one buried insulator portion 22 (See FIG. 11) is approximated by at least one buried insulator portion area 122. The cross-sectional area of at least one top semiconductor portion 32 (See FIG. 11) is approximated by at least one top semiconductor portion area 132. The effect of a silicon oxide plug 94 is assumed to be insignificant, and a void area 199 was introduced in the area of the silicon oxide plug 94. In this two-dimensional model, a top surface of the insulator stressor plug area 182 is located at the bottom surface of the at least one top semiconductor portion area 132.

The insulator stressor plug area 182 is assumed to have the same property as one of tensile silicon nitride material known in the art.

FIG. 19 is a plot of lateral stress from a simulation employing the two-dimensional model of FIG. 15. Lateral tensile stress up to about 1.8 GPa is observed in the at least one top semiconductor portion area 132. In most regions of the at least one top semiconductor portion area 132, the lateral tensile stress is greater than 0.5 GPa. The magnitude of the lateral tensile stress falls below 0.5 GPa only near the boundary with the insulator stressor plug area 182 (See FIG. 18). Thus, the magnitude of the tensile stress may be greater than 0.5 GPa in a region in the at least one top semiconductor portion 32 in the exemplary semiconductor structures demonstrated above.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a semiconductor structure comprising:
    providing a semiconductor-on-insulator (SOI) substrate including a handle substrate consisting of a single crystalline semiconductor material, a buried insulating layer present on said handle substrate, and a top semiconductor layer present on said buried insulating layer;
    forming a trench extending from a top surface of said SOI substrate to a depth beneath a bottom surface of said buried insulating layer of said SOI substrate to physically expose a portion of said handle substrate at a bottom of said trench, wherein said trench laterally abuts and encloses at least one top semiconductor portion formed in said top semiconductor layer of said SOI substrate; and
    forming a stack of an insulator stressor plug and a silicon oxide plug in said trench, wherein said insulator stressor plug abuts said portion of said handle substrate exposed at said bottom of said trench, wherein said silicon oxide plug is substantially coplanar with a top surface of said at least one top semiconductor portion and has sidewalls in direct contact with sidewalls of said trench, and wherein an interface between said insulator stressor plug and said silicon oxide plug is coplanar with said bottom surface of said buried insulating layer.

2. The method of claim 1, further comprising:
    forming a stack of pad layers directly on said SOI substrate;
    applying a photoresist on said stack of pad layers and lithographically patterning said photoresist; and
    transferring a pattern in said photoresist into said stack of pad layers and said SOI substrate by at least one reactive etch.

3. The method of claim 1, wherein said insulator stressor plug comprises a silicon nitride.

4. The method of claim 3, wherein the insulator stressor plug applies a compressive stress or a tensile stress to said at least one top semiconductor portion.

5. The method of claim 3, wherein said insulator stressor plug is formed by a deposition process selected from the group consisting of plasma enhanced chemical vapor deposition (PECVD), high density plasma chemical vapor deposition (HDPCVD), rapid thermal chemical vapor deposition (RTCVD), low pressure chemical vapor deposition (LPCVD), and a combination thereof.

6. The method of claim 1, wherein said forming said stack of said insulator stressor plug and said silicon oxide plug in said trench comprises:
    depositing a stress-generating material into said trench;
    recessing said stress-generating material in said trench to form said insulator stressor plug;
    depositing a silicon oxide into said trench on top of said insulator stressor plug; and
    recessing said silicon oxide in said trench to form said silicon oxide plug.

7. The method of claim 6, wherein said recessing of said silicon oxide comprises reactive ion etching (RIE).

8. The method of claim 1, wherein a thickness of said at least one top semiconductor portion is from about 5 nm to about 300 nm.

9. The method of claim 8, wherein a depth of said trench is from about 200 nm to about 8,000 nm.

10. A method of forming a semiconductor structure comprising:
    providing a semiconductor-on-insulator (SOI) substrate including a handle substrate consisting of a single crystalline semiconductor material, a buried insulator layer present on said handle substrate, and a top semiconductor layer present on said buried insulator layer;
    forming a trench extending from a top surface of said top semiconductor layer of said SOI substrate into said handle substrate of said SOI substrate, wherein said trench laterally abuts and encloses at least one top semiconductor portion formed in said top semiconductor layer of said SOI substrate;
    depositing a silicon nitride into said trench to completely fill said trench;
    recessing said silicon nitride in said trench such that a top surface of said silicon nitride is coplanar with a bottom surface of said buried insulator layer to form an insulator stressor plug, said insulator stressor plug spanning an entire width of said trench; and
    forming a silicon oxide plug over said insulator stressor plug in said trench, said silicon oxide plug having a top surface substantially coplanar with said top surface of said top semiconductor layer.

11. The method of claim 10, wherein said insulator stressor plug applies a compressive stress or a tensile stress to said at least one top semiconductor portion.

12. The method of claim 10, wherein said insulator stressor plug is formed by a deposition process selected from the group consisting of plasma enhanced chemical vapor deposition (PECVD), high density plasma chemical vapor deposition (HDPCVD), rapid thermal chemical vapor deposition (RTCVD), low pressure chemical vapor deposition (LPCVD), and a combination thereof.

13. The method of claim 10, wherein a thickness of said at least one top semiconductor portion is from about 5 nm to about 300 nm.

14. The method of claim 10, wherein a depth of said trench is from about 200 nm to about 8,000 nm.

* * * * *